(12) United States Patent
Kaneko et al.

(10) Patent No.: US 10,835,908 B2
(45) Date of Patent: Nov. 17, 2020

(54) SUBSTRATE PROCESSING METHOD

(71) Applicant: Tokyo Electron Limited, Tokyo (JP)

(72) Inventors: Miyako Kaneko, Nirasaki (JP); Takehiko Orii, Nirasaki (JP); Itaru Kanno, Tokyo (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/988,129

(22) Filed: May 24, 2018

(65) Prior Publication Data

US 2018/0264492 A1 Sep. 20, 2018

Related U.S. Application Data

(62) Division of application No. 14/468,796, filed on Aug. 26, 2014, now abandoned.

(30) Foreign Application Priority Data

Aug. 27, 2013 (JP) .................................. 2013-176086
Feb. 6, 2014 (JP) .................................. 2014-021599
Feb. 6, 2014 (JP) .................................. 2014-021710

(51) Int. Cl.
| | | |
|---|---|---|
| *B05B 9/00* | (2006.01) |
| *H01L 21/02* | (2006.01) |
| *H01L 21/67* | (2006.01) |
| *B05B 7/24* | (2006.01) |
| *B05B 12/14* | (2006.01) |
| *H01L 21/768* | (2006.01) |
| *B05B 16/20* | (2018.01) |
| *B05B 13/02* | (2006.01) |

(52) U.S. Cl.
CPC ............. *B05B 9/00* (2013.01); *B05B 7/2497* (2013.01); *B05B 12/14* (2013.01); *B05B 16/20* (2018.02); *H01L 21/02063* (2013.01); *H01L 21/6715* (2013.01); *H01L 21/76814* (2013.01); *B05B 13/0228* (2013.01)

(58) Field of Classification Search
None
See application file for complete search history.

(56) References Cited

U.S. PATENT DOCUMENTS

| | | |
|---|---|---|
| 6,143,126 A | 11/2000 | Stevens |
| 6,503,365 B1 | 1/2003 | Kim et al. |

(Continued)

FOREIGN PATENT DOCUMENTS

| | | |
|---|---|---|
| JP | S50-5021 | 2/1975 |
| JP | H04-014222 A | 1/1992 |

(Continued)

*Primary Examiner* — Allan W. Olsen
(74) *Attorney, Agent, or Firm* — Pearne & Gordon LLP

(57) ABSTRACT

Productivity can be improved. A substrate processing method includes a processing liquid supplying process of supplying a processing liquid, which contains a volatile component and forms a film on a substrate, onto the substrate on which a pre-treatment, which requires atmosphere management or time management after the pre-treatment, is performed; and an accommodating process of accommodating, in a transfer container, the substrate on which the processing liquid is solidified or cured by volatilization of the volatile component.

11 Claims, 12 Drawing Sheets

(56) References Cited

U.S. PATENT DOCUMENTS

| | | | |
|---|---|---|---|
| 2003/0039766 A1* | 2/2003 | Barnes | C23C 16/54 427/569 |
| 2003/0045131 A1 | 3/2003 | Verbeke et al. | |
| 2005/0176259 A1* | 8/2005 | Yokoi | G03F 7/425 438/745 |
| 2008/0057221 A1 | 3/2008 | Boyd et al. | |
| 2008/0203380 A1* | 8/2008 | Wang | B82Y 10/00 257/9 |
| 2009/0253258 A1 | 10/2009 | Hara et al. | |
| 2012/0312474 A1 | 12/2012 | Kwak et al. | |
| 2014/0041685 A1* | 2/2014 | Kaneko | H01L 21/02041 134/4 |
| 2014/0144464 A1* | 5/2014 | Kaneko | H01L 21/67046 134/4 |
| 2014/0144465 A1* | 5/2014 | Kaneko | H01L 21/67051 134/4 |
| 2015/0064910 A1* | 3/2015 | Kaneko | H01L 21/67051 438/694 |
| 2015/0128995 A1* | 5/2015 | Kaneko | B08B 7/0014 134/4 |

FOREIGN PATENT DOCUMENTS

| | | | |
|---|---|---|---|
| JP | H09-007912 A | 1/1997 | |
| JP | H11-176791 A | 7/1999 | |
| JP | 2005-051001 A | 2/2005 | |
| JP | 2006-186081 A | 7/2006 | |
| JP | 2006-527783 A | 12/2006 | |
| JP | 2007-142331 A | 6/2007 | |
| JP | 2010-027786 A | 2/2008 | |
| JP | 2008-060368 A | 3/2008 | |
| JP | 2008-124226 A | 5/2008 | |
| JP | 2010-027786 A | 2/2010 | |
| JP | 2010-114414 A | 5/2010 | |
| JP | 2010-225827 A | 10/2010 | |
| KR | 10-0748903 B1 | 8/2007 | |
| KR | 10-1123705 B1 | 3/2012 | |
| WO | 2004/113486 A1 | 12/2004 | |

* cited by examiner

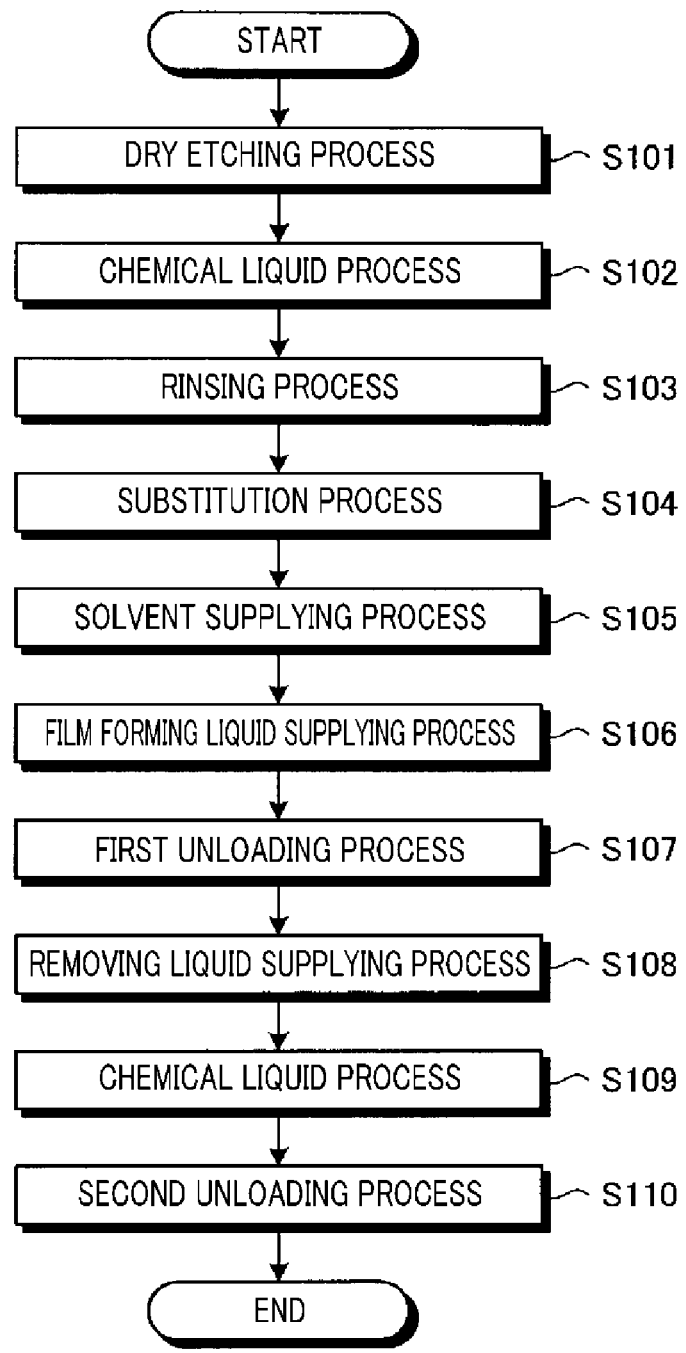

FIG. 17

| PROCESS | |
|---|---|
| PRE-TREATMENT | POST-TREATMENT |
| DRY ETCHING | WET CLEANING |
| DRY ETCHING | DRY ETCHING |
| FILM FORMING | FILM FORMING |
| WET CLEANING | FILM FORMING |

SUBSTRATE PROCESSING METHOD

CROSS-REFERENCE TO RELATED APPLICATION

This is a divisional application of U.S. patent application Ser. No. 14/468,796, filed on Aug. 26, 2014, which claims the benefit of Japanese Patent Application Nos. 2013-176086, 2014-021599 and 2014-021710 filed on Aug. 27, 2013, Feb. 6, 2014 and Feb. 6, 2014, respectively, the entire disclosures of which are incorporated herein by reference.

TECHNICAL FIELD

The embodiments described herein pertain generally to a substrate processing method, a substrate processing apparatus and a storage medium.

BACKGROUND

Conventionally, there is known a dry etching process in which a dry etching process is performed on a substrate such as a semiconductor wafer to expose a part of a metal wiring formed within the substrate (see, for example, Patent Document 1).

If, however, the substrate is exposed for a long time after the metal wiring within the substrate is exposed through such a dry etching process, an adverse effect such as oxidation of the exposed metal wiring or the like may be caused. For this reason, there is set a time limit (Q-time) in exposure time after the dry etching process.

Patent Document 1: Japanese Patent Laid-open Publication No. 2010-027786

In the above-described conventional technology, however, time management is required to keep the time limit (Q-time). Thus, productivity may be decreased due to the increase of the number of required processes.

The problem that productivity is decreased may also occur when performing a wet etching process, a film forming process, or the like as well as when performing the dry etching process.

SUMMARY

In view of the foregoing problem, example embodiments provide a substrate processing method, a substrate processing apparatus and a storage medium capable of improving productivity.

In one example embodiment, a substrate processing method includes a processing liquid supplying process of supplying a processing liquid, which contains a volatile component and forms a film on a substrate, onto the substrate on which a pre-treatment, which requires atmosphere management or time management after the pre-treatment, is performed; and an accommodating process of accommodating, in a transfer container, the substrate on which the processing liquid is solidified or cured by volatilization of the volatile component.

In accordance with the example embodiment, it is possible to improve productivity.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 8 is a flowchart for describing a process sequence of processing a substrate in accordance with the first example embodiment;

FIG. 17 is a table showing example processes to which the film forming liquid supplying process and the removing process are applied.

DETAILED DESCRIPTION

Figure 1A:
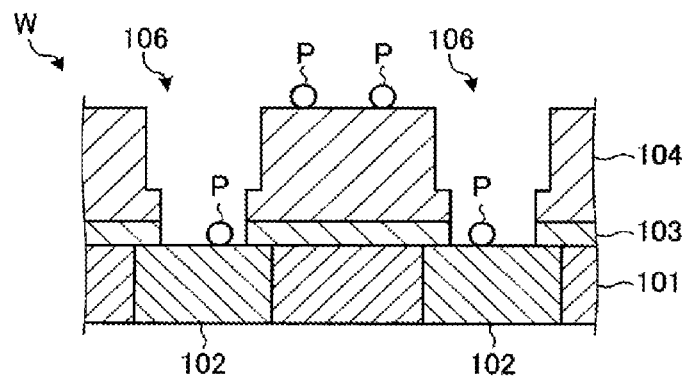
FIG. 1A is a diagram for describing a substrate processing method in accordance with a first example embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current example embodiment. Still, the example embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, a substrate processing method, a substrate processing apparatus, and a storage medium in accordance with example embodiments will be described in detail with reference to the accompanying drawings. It should be noted herein that the example embodiments are not limiting.

First Example Embodiment

<Substrate Processing Method>

Figure 1B:
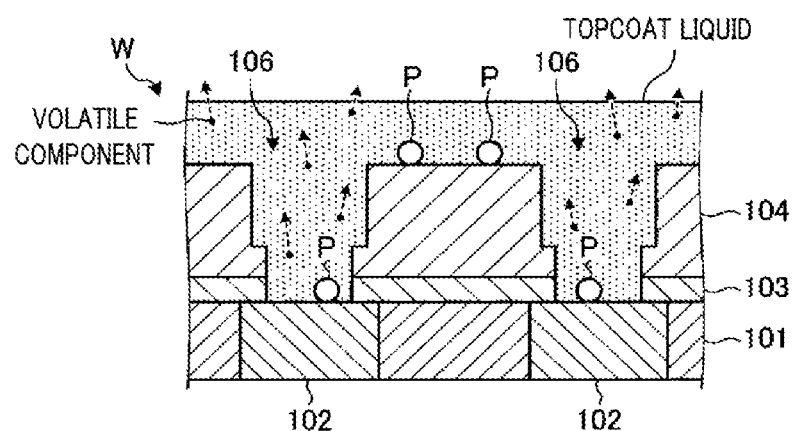
FIG. 1B is a diagram for describing the substrate processing method in accordance with the first example embodiment.
Figure 1C:
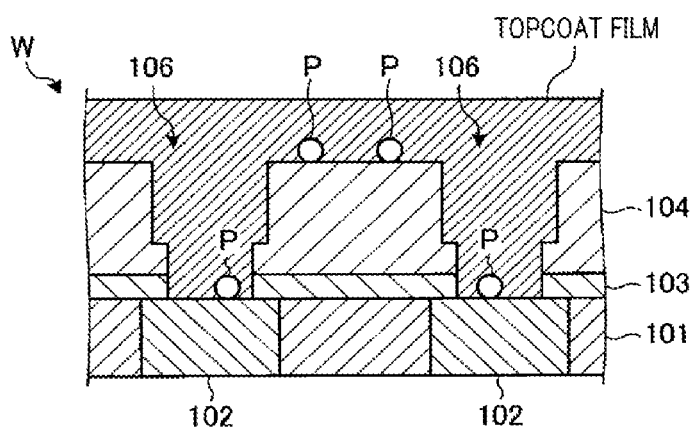
FIG. 1C is a diagram for describing the substrate processing method in accordance with the first example embodiment.

First, a substrate processing method in accordance with a first example embodiment will be elaborated with reference to FIG. 1A to FIG. 1C. FIG. 1A to FIG. 1C are diagrams for describing the substrate processing method of the first example embodiment.

In accordance with, the substrate processing method of the first example embodiment, it is possible to process a substrate such as a semiconductor wafer (hereinafter, simply referred to as "wafer W"), in which at least a part of a metal wiring formed therein is exposed, without being restricted by Q-time.

Here, the term "Q-time" means, for example, a time limit set in the exposure time after a dry etching in order to suppress the metal wiring exposed by the dry etching from being oxidized.

Once the Q-time is set, time management for keeping the Q-time is required. Accordingly, productivity may be decreased due to the increase of the number of required processes. Further, if the set Q-time is short, line management may be difficult. Thus, there is a concern that the productivity is decreased since the line management is complicated.

As depicted in FIG. 1A, a wafer W has, for example, a wiring layer 101, a liner film 103 and an interlayer insulating film 104. The wiring layer 101, the liner film 103 and the interlayer insulating film 104 are stacked on top of each other in this sequence. A Cu wiring 102 as an example of a metal wiring is formed in the wiring layer 101.

Further, the wafer W also has a via hole 106. The via hole 106 is formed by the dry etching. The via hole 106 is extended to the wiring layer 101, and a surface of the Cu wiring 102 is exposed at a bottom of the via hole 106.

In the substrate processing method in accordance with the first example embodiment, as depicted in FIG. 1B, a processing liquid, which contains a volatile component and is configured to form a film on the wafer W (hereinafter, simply referred to as "film forming liquid"), is supplied onto the wafer W. To elaborate, in the first example embodiment, a film forming liquid for forming a topcoat film on the wafer W (hereinafter, referred to as "topcoat liquid") is supplied onto the wafer W.

Here, the topcoat film refers to a protection film coated on a top surface of a resist film in order to suppress an immersion liquid from being introduced into the resist film.

Here, the immersion liquid may be a liquid for use in, for example, liquid immersion exposure in a lithography process.

As the volatile component contained in the topcoat liquid is volatilized, the topcoat liquid supplied on the wafer W undergoes volume shrinkage to be solidified or cured into a topcoat film (see FIG. 1C). Further, the topcoat liquid also includes an acrylic resin of which volume tends to be shrunk while being solidified or cured. The volume shrinkage of the topcoat liquid is also caused by cure shrinkage of this acrylic resin as well. Here, the term "being solidified" implies changing into a solid, and the term "being cured" implies that molecules are interlinked to be a polymer (e.g., cross-linking, polymerization, etc.).

If the topcoat film is formed on the wafer W, the Cu wiring 102 exposed by the dry etching is covered with the topcoat film. In this state, the wafer W is accommodated into a transfer container.

According to the substrate processing method of the first example embodiment, by protecting the exposed Cu wiring 102 with the topcoat film, the exposed Cu wiring 102 may be suppressed from being adversely influenced by, for example, oxidation. Thus, the Q-time need not be set. Since the Q-time is unnecessary, the time management for observing the Q-time is not needed, so that complication of line management that might be accompanied by observance of the Q-time can be avoided. Accordingly, in accordance with the substrate processing method of the first example embodiment, productivity can be improved.

Further, a reaction product P grows as a residual gas in the dry etching reacts with moisture or oxygen in the atmosphere. However, in accordance with the substrate processing method of the first example embodiment, by protecting the exposed Cu wiring 102 with the topcoat film, growth of the reaction product P can be suppressed. Accordingly, an adverse influence from the reaction product P, such as deterioration of electrical characteristics or decrease of yield, can be suppressed.

Further, in the substrate processing method in accordance with the first example embodiment, after the wafer W accommodated into the transfer container is taken out, there is performed a process of removing the topcoat film formed on the wafer W. Through this process of removing the topcoat film, the reaction product P such as polymer, which is generated by dry etching or aching, can be removed.

To elaborate, a removing liquid configured to remove the topcoat film is supplied onto the topcoat film. In the first example embodiment, an alkali developer is used as the removing liquid.

By supplying the alkali developer, the topcoat film is peeled off from the wafer W. At this time, the reaction product P remaining on the wafer W is also peeled off from the wafer W along with the topcoat film. Accordingly, the reaction product P can be removed.

As stated above, according to the substrate processing method of the first example embodiment, since the reaction product can be removed without using chemical action, it is possible to suppress damage on the Cu wiring 102 that might be caused by the etching or the like.

Thus, in accordance with the substrate processing method of the first example embodiment, it is possible to remove the reaction product P remaining on the wafer W after the dry etching or aching, while suppressing damage on the wafer W. Further, the topcoat film is efficiently removed from the wafer W without performing the pattern exposure after formed on the wafer W.

The topcoat liquid undergoes volume shrinkage to be solidified or cured into the topcoat film. The reaction product P remaining on the wafer W can be removed from the wafer W by a distortion (tensile force) caused by the volume shrinkage of the topcoat liquid.

Since the volume shrinkage of the topcoat liquid occurs as a result of the volatilization of the volatile component and the cure shrinkage of the acrylic resin, a volume shrinkage rate thereof may be higher than that of a film forming liquid containing a volatile component only. Thus, the reaction product P can be peeled off from the wafer W forcibly. Especially, since the degree of cure shrinkage of the acrylic resin is higher than that of other resins such as an epoxy resin, the acrylic resin can effectively remove the reaction product P, so that the acrylic resin is suitable for the topcoat liquid.

Further, the topcoat film is swelled when it is peeled off by the alkali developer. Thus, in accordance with the substrate processing method of the first example embodiment, it is possible to remove the reaction product P from the wafer W forcibly through volume expansion caused by the swelling of the topcoat film as well as the volume shrinkage caused by the volatilization of the topcoat liquid.

Further, in the first example embodiment, by using the alkali liquid to remove the reaction product P, the removing efficiency may be increased.

By supplying the alkali developer, zeta potentials having the same polarity are generated on the surfaces of the wafer W and the reaction product P. The reaction product P peeled off from the wafer W by the volume change of the topcoat liquid is charged with the zeta potential having the same polarity as that of the wafer W, so that the reaction product P and the wafer W are repelled against each other. As a result, the reaction product P can be suppressed from being re-attached to the wafer W.

As mentioned above, after the reaction product P is removed from the wafer W or the like through the volume shrinkage of the topcoat film, by generating the zeta potentials having the same polarity on the wafer W and the reaction product P, it is possible to suppress the reaction product P from being re-attached to the wafer W. Thus, the removing efficiency for the reaction product P can be increased.

Further, the alkali developer may contain at least one of, but not limited to, ammonia, TMAH (Tetra Methyl Ammonium Hydroxide), and a choline aqueous liquid.

Further, according to the substrate processing method of the first example embodiment, it is also possible to remove the reaction product P that has entered the via hole 106, which has been difficult to be removed in a cleaning method using a physical force, for example.

The topcoat film formed on the wafer W is completely removed from the wafer W. Thus, after the topcoat film is removed, the wafer W returns to the state before the topcoat liquid is supplied, i.e. a state in which the Cu wiring 102 is exposed.

<Configuration of Substrate Processing System>

Figure 2:
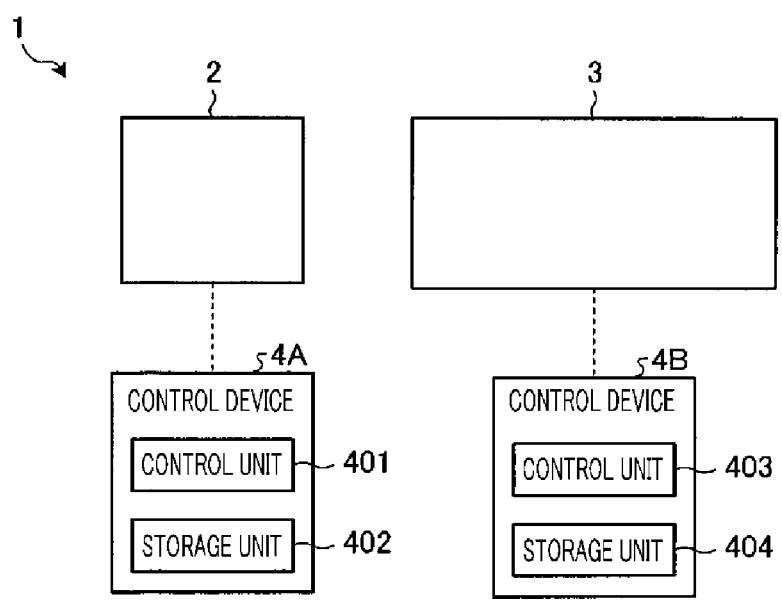
FIG. 2 is a diagram illustrating a schematic configuration of a substrate processing system in accordance with the first example embodiment.

Now, a substrate processing system configured to perform the above-described substrate processing method will be explained with reference to FIG. 2. FIG. 2 is a diagram depicting a schematic configuration of the substrate processing system in accordance with the first example embodiment.

As depicted in FIG. 2, the substrate processing system 1 in the first example embodiment includes a first processing apparatus 2 as a pre-treatment apparatus and a second processing apparatus 3 as a post-treatment apparatus. Further, the substrate processing system 1 also includes a first control device 4A and a second control device 4B.

The first processing apparatus 2 is configured to perform the dry etching or supply a topcoat liquid onto the wafer W, and the second processing apparatus 3 is configured to supply the alkali developer onto the wafer W processed by the first processing apparatus 2.

The first control device 4A may be implemented by, but not limited to, a computer and includes a control unit 401 and a storage unit 402. The storage unit 402 includes a storage device such as a RAM (Random Access Memory), a ROM (Read Only Memory), a hard disk, etc., and is configured to store therein programs for controlling various kinds of processes performed in the first processing apparatus 2. The control unit 401 may be, but not limited to, a CPU (Central Processing Unit). The control unit 401 reads out the programs from the storage unit 402 and executes the programs to control the operation of the first processing apparatus 2.

Likewise, the second control device 4B may also be implemented by, for example a computer and includes a control unit 403 and a storage unit 404. The storage unit 404 includes a storage device such as a RAM, a ROM, a hard disk, etc., and is configured to store therein programs for controlling various kinds of processes performed in the second processing apparatus 3. The control unit 403 may be, but not limited to, a CPU. The control unit 403 reads out the programs from the storage unit 404 and executes the programs to control the operation of the second processing apparatus 3.

Here, the programs may be stored in a computer-readable storage medium and installed in the storage unit 402 of the first control device 4A or the storage unit 404 of the second control device 4B from the storage medium. The computer-readable storage medium may include, but not limited to, a hard disk HD, a flexible disk (FD), a compact disk (CD), a magnet optical disk (MO), a memory card, and so forth.

<Configuration of First Processing Apparatus>

Figure 3:
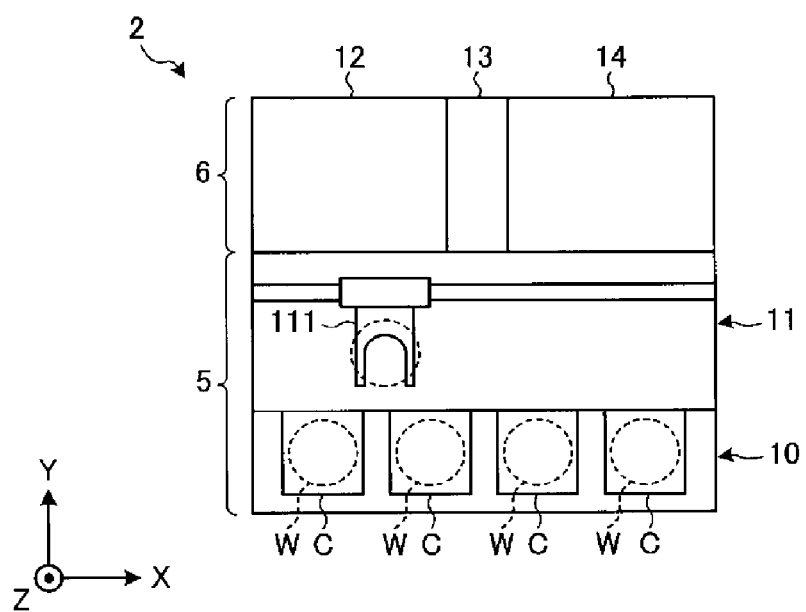
FIG. 3 is a diagram illustrating a schematic configuration of a first processing apparatus.

Now, a configuration of the first processing apparatus 2 will be discussed with reference to FIG. 3. FIG. 3 is a diagram depicting a schematic configuration of the first processing apparatus 2. In the following description, to clarify a positional relationship, X, Y and Z axes orthogonal to each other are defined, and a positive direction on the Z axis is set as a vertical upward direction.

As shown in FIG. 3, the first processing apparatus 2 includes a loading/unloading station 5 and a processing station 6. The loading/unloading station 5 and the processing station 6 are located adjacent to each other.

The loading/unloading station 5 includes a mounting unit 10 and a transfer unit 11. The mounting unit 10 is configured to mount thereon a multiple number of transfer containers (hereinafter, referred to as "carriers C") accommodating therein multiple wafers W in a horizontal posture.

The transfer unit 11 is located adjacent to the mounting unit 10 and includes therein a substrate transfer device 111. The substrate transfer device 111 includes a wafer holding device configured to hold the wafer W. Further, the substrate transfer device 111 is configured to be movable in the horizontal direction and the vertical direction and rotatable about a vertical axis. This substrate transfer device 111 serves to transfer the wafer W between the carrier C and the processing station 6 by using the wafer holding device.

To elaborate, the substrate transfer device 111 is configured to take out a wafer W from the carrier C mounted on the mounting unit 10 and load the wafer W into a dry etching unit 12 of the processing station 6 to be described later.

Further, the substrate transfer device 111 is also configured to take out the wafer W from a first liquid processing unit 14 of the processing station 6 to be described later and return the wafer W back into the carrier C on the mounting unit 10.

The processing station 6 is provided adjacent to the transfer unit 11. The processing station 6 includes the dry etching unit 12, a load lock chamber 13 and the first liquid processing unit 14.

The dry etching unit 12 corresponds to an example pre-treatment unit and is configured to perform a dry etching process on the wafer W loaded therein by the substrate transfer device 111. Through this dry etching process, the via hole 106 is formed, and the Cu wiring 102 (see FIG. 1A) within the wafer W is exposed.

Further, the dry etching process is performed in a depressurized state. Moreover, in the dry etching unit 12, an aching process of removing unnecessary resist can also be performed after the dry etching process.

The load lock chamber 13 may switch an internal pressure thereof between an atmospheric pressure and a depressurized pressure. A non-illustrated substrate transfer device is provided within the load lock chamber 13. Upon the completion of the process in the dry etching unit 12, the processed wafer W is unloaded from the dry etching unit 12 by the non-illustrated substrate transfer device of the load lock chamber 13, and then, is loaded into the first liquid processing unit 14.

To elaborate, the inside of the load lock chamber 13 is maintained in the depressurized state until the wafer W is unloaded from the dry etching unit 12. Then, after the unloading of the wafer W is completed, an inert gas such as nitrogen or argon is supplied into the load lock chamber 13 and the inside of the load lock chamber 13 is switched into the atmospheric pressure state. Under this atmospheric pressure state, the wafer W is loaded into the first liquid processing unit 14.

Accordingly, since the wafer W is blocked from the exterior air until it is loaded into the first liquid processing unit 14 after unloaded from the dry etching unit 12, the exposed Cu wiring 102 may be suppressed from being oxidized.

Subsequently, the first liquid processing unit 14 performs a film forming liquid supplying process of supplying the topcoat liquid onto the wafer W. As stated above, the topcoat liquid supplied on the wafer W undergoes volume shrinkage to be solidified or cured into the topcoat film. As a result, the exposed Cu wiring 102 is covered with the topcoat film.

Upon the completion of the film forming liquid supplying process, the processed wafer W is accommodated into the carrier C by the substrate transfer device 111, and then, is transferred into the second processing apparatus 3.

<Configuration of Second Processing Apparatus>

Figure 4:
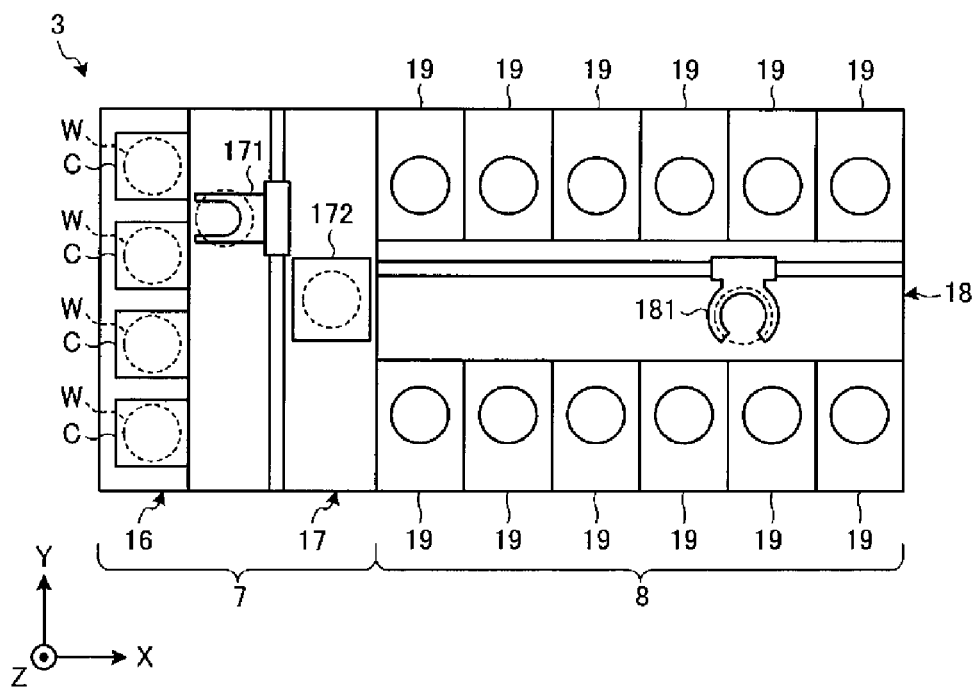
FIG. 4 is a diagram illustrating a schematic configuration of a second processing apparatus.

Now, a configuration of the second processing apparatus 3 will be explained with reference to FIG. 4. FIG. 4 is a diagram depicting a schematic configuration of the second processing apparatus.

As shown in FIG. 4, the second processing apparatus 3 includes a loading/unloading station 7 and a processing station 8. The loading/unloading station 7 and the processing station 8 are provided adjacent to each other.

The loading/unloading station 7 includes a mounting unit 16 and a transfer unit 17. The mounting unit 16 is configured to mount thereon a multiple number of carriers C.

The transfer unit 17 is located adjacent to the mounting unit 16 and includes therein a substrate transfer device 171 and a transit unit 172. The substrate transfer device 171 includes a wafer holding device configured to hold thereon the wafer W. Further, the substrate transfer device 171 is configured to be movable in a horizontal direction and a vertical direction and rotatable about a vertical axis. This substrate transfer device 171 serves to transfer the wafer W between the carrier C and the transit unit 172 by using the wafer holding device.

The processing station 8 is provided adjacent to the transfer unit 17. The processing station 8 includes a transfer unit 18 and multiple second liquid processing units 19. The multiple liquid processing units 19 are arranged at both sides of the transfer unit 18 side by side.

The transfer unit 18 includes therein a substrate transfer device 181. The substrate transfer device 181 has a wafer holding device configured to hold the wafer W. Further, the substrate transfer device 181 is configured to be movable in a horizontal direction and a vertical direction and rotatable about a vertical axis. This substrate transfer device 181 serves to transfer the wafer W between the transit unit 172 and the second liquid processing unit 19 by using the wafer holding device.

In the second processing apparatus 3, the substrate transfer device 171 of the loading/unloading station 7 is configured to take out, from the carrier C, the wafer W processed by the first processing apparatus 2, and then, is configured to mount the wafer W on the transit unit 172. The wafer W mounted on the transit unit 172 is unloaded from the transit unit 172 by the substrate transfer device 181 of the processing station 8, and then, is loaded into the second liquid processing unit 19.

In the second liquid processing unit 19, a process of removing the topcoat film by supplying the alkali developer onto the wafer W is performed. In this process, as the topcoat film is peeled off, the reaction product P left on the wafer W is also removed. Further, in this second liquid processing unit 19, the wafer W from which the topcoat film is removed is cleaned by a chemical liquid. Here, a DHF (Dilute HydroFluoric acid) is used as the chemical liquid.

Subsequently, the wafer W is unloaded from the second liquid processing unit 19 by the substrate transfer device 181, and then, mounted on the substrate transit unit 172. Then, the processed wafer W mounted on the transit unit 172 is returned back to the carrier C of the mounting unit 16 by the substrate transfer device 171.

<Configuration of Dry Etching Unit>

Figure 5:
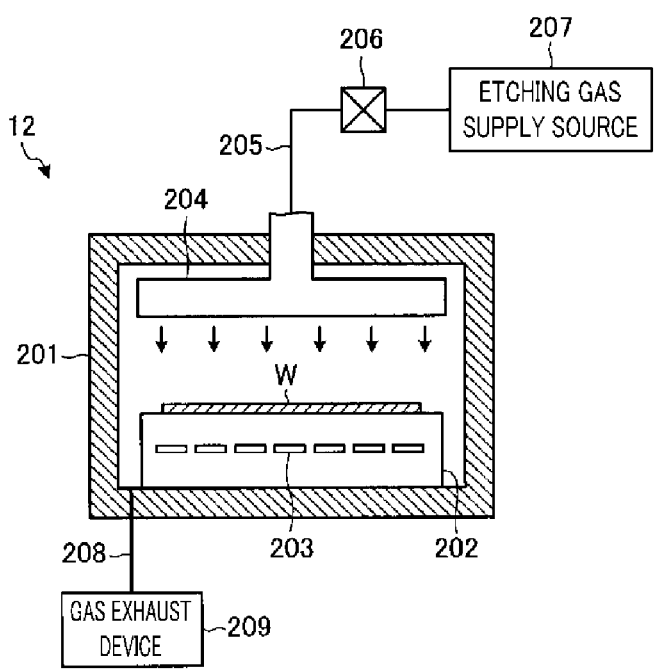
FIG. 5 is a schematic diagram depicting an example configuration of a dry etching unit.

Now, a configuration of each unit included in the first processing apparatus 2 and the second processing apparatus 3 will be explained. First, a configuration of the dry etching unit 12 of the first processing apparatus 2 will be described with reference to FIG. 5. FIG. 5 is a schematic diagram illustrating an example configuration of the dry etching unit 12.

As depicted in FIG. 5, the dry etching unit 12 includes a hermetically sealed chamber 201 configured to accommodate therein a wafer W, and a mounting table 202 configured to mount thereon the wafer W in a horizontal posture is provided within the chamber 201. The mounting table 202 includes a temperature control device 203 configured to control a temperature of the wafer W to a preset value by cooling or heating the wafer W. A loading/unloading opening (not shown) through which the wafer W is loaded and unloaded into and from the load lock chamber 13 is formed at a sidewall of the chamber 201.

A shower head 204 is provided at a ceiling of the chamber 201, and a gas supply line 205 is connected to the shower head 204. The gas supply line 205 is connected to an etching gas supply source 207 via a valve 206, and a preset etching gas is supplied to the shower head 204 from the etching gas supply source 207. The shower head 204 is configured to introduce the etching gas supplied from the etching gas supply source 207 into the chamber 201.

The etching gas supplied from the etching gas supply source 207 may be, but not limited to, a $CH_3F$ gas, a $CH_2F_2$ gas, a $CF_4$ gas, an $O_2$ gas, an Ar gas, or the like.

A gas exhaust device 209 is connected to a bottom of the chamber 201 via a gas exhaust line 208. The inside of the chamber 201 is maintained at a depressurized pressure by the gas exhaust device 209.

The dry etching unit 12 is configured as described above. While depressurizing the inside of the chamber 201 by using the gas exhaust device 209, the etching gas is supplied into the chamber 201 from the shower head 204, so that the wafer W mounted on the mounting table 202 is dry-etched. As a result, the via hole 106 (see FIG. 1A) is formed in the wafer W, and the Cu wiring 102 is exposed.

In the dry etching unit 12, after dry-etching the interlayer insulating film 104 (see FIG. 1A) by using, for example, a resist film as a mask, an aching process of removing the resist film may also be performed.

<Configuration of First Liquid Processing Unit>

Figure 6:
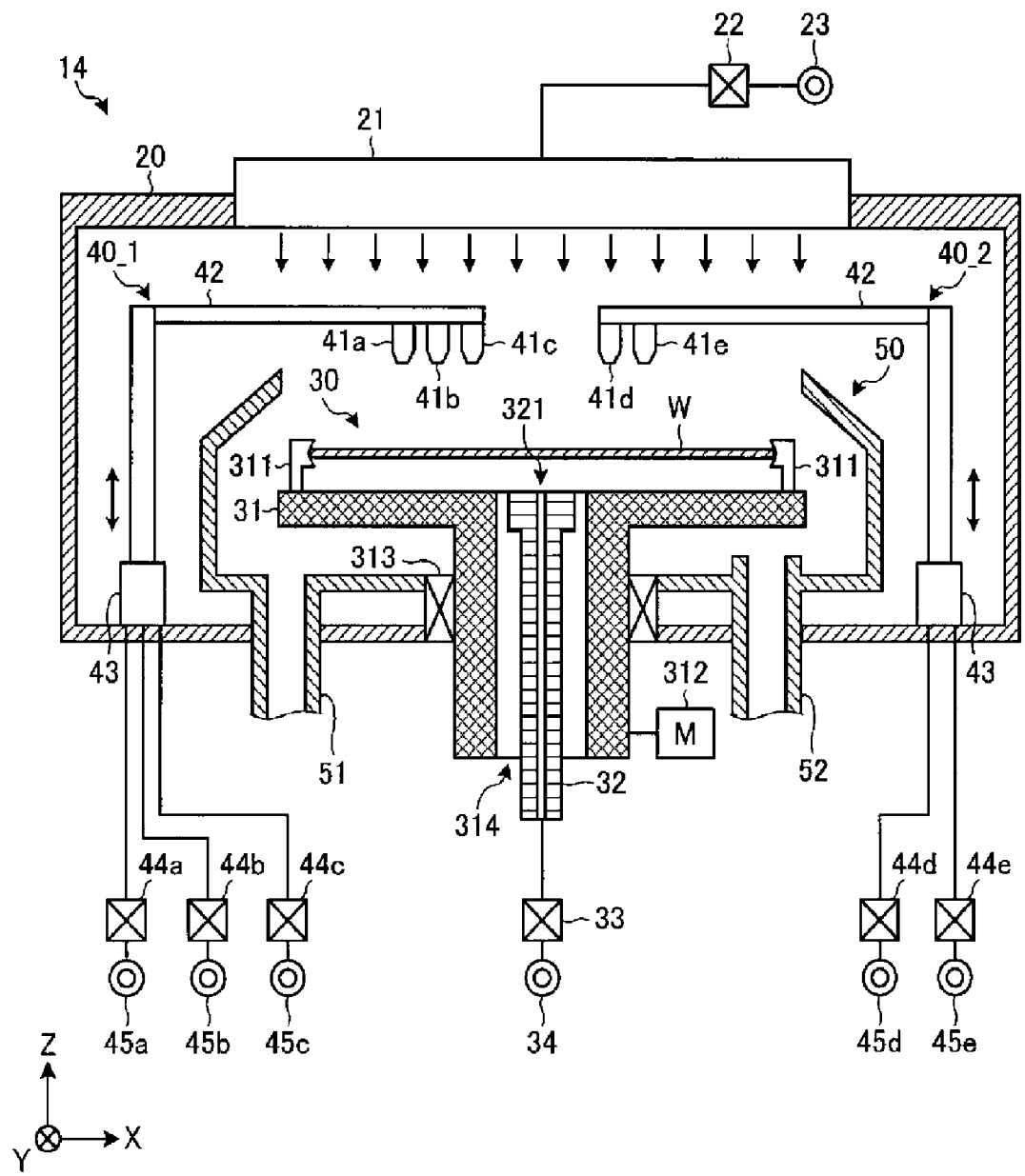
FIG. 6 is a schematic diagram depicting an example configuration of a first liquid processing unit.

Now, the first liquid processing unit 14 of the first processing apparatus 2 will be explained with reference to FIG. 6. FIG. 6 is a schematic diagram illustrating an example configuration of the first liquid processing unit 14.

As depicted in FIG. 6, the first liquid processing unit 14 includes a chamber 20, a substrate holding device 30, liquid supply units 40_1 and 40_2, and a collecting cup 50.

The chamber 20 is configured to accommodate therein the substrate holding device 30, the liquid supply unites 40_1 and 40_2 and the collecting cup 50. A FFU (Fan Filter Unit) 21 is provided at a ceiling of the chamber 20. The FFU 21 generates a downflow in the chamber 20.

The FFU 21 is connected to an inert gas supply source 23 via a valve 22. The FFU 21 is configured to discharge an inert gas such as an $N_2$ gas supplied from the inert gas supply source 23 into the chamber 20. In this way, by using the inert gas as a downflow gas, the exposed Cu wiring 102 (see FIG. 1A) can be suppressed from being oxidized.

The substrate holding device 30 includes a rotating/holding unit 31 configured to hold a wafer W while rotating the wafer W; and a fluid supply unit 32 which is inserted through a hollow portion 314 of the rotating/holding unit 31 and is configured to supply a gas toward a rear surface of the wafer W.

The rotating/holding unit 31 is provided at a substantially central portion of the chamber 20. A holding member 311 configured to hold the wafer W from a lateral side thereof is provided on a top surface of the rotating/holding unit 31. The wafer W is horizontally held by the holding member 311 while slightly spaced apart from the top surface of the rotating/holding unit 311.

Further, the rotating/holding unit 31 also includes a driving device 312 having, for example, a motor and a belt that delivers a rotary power of the motor to the rotating/holding unit 31. The rotating/holding unit 31 is rotated about a vertical axis by operating the driving device 312. As the rotating/holding device 31 is rotated, the wafer W held on the rotating/holding unit 31 is also rotated as one body with the rotating/holding unit 31. Further, the rotating/holding unit 31 is rotatably supported at the chamber 20 and the collecting cup 50 via a bearing 313.

The fluid supply unit 32 is inserted through the hollow portion 314 in a central portion of the rotating/holding unit 31. A flow path 321 is formed within the fluid supply unit 32, and an $N_2$ supply source 34 is connected to the flow path 321 via a valve 33. The fluid supply unit 32 supplies an $N_2$ gas from the $N_2$ gas supply source 34 to the rear surface of the wafer W through the valve 33 and the flow path 321.

The $N_2$ gas supplied via the valve 33 has a high temperature (e.g., about 90° C.) and is used in a volatilization accelerating process to be described later.

When receiving the wafer W from the non-illustrated substrate transfer device of the load lock chamber 13, the fluid supply unit 32 is raised by a non-illustrated elevating device, and the substrate holding device 30 mounts the wafer W on non-illustrated supporting pins provided on a top surface of the fluid supply unit 32. Thereafter, the substrate holding device 30 lowers the fluid supply unit 32 to a preset position to deliver the wafer W onto the holding member 311 of the rotating/holding unit 31. Further, when transferring the processed wafer W to the substrate transfer device 111, the substrate holding unit 30 raises the fluid supply unit 32 by using the non-illustrated elevating device and mounts the processed wafer W held by the holding member 311 on the non-illustrated supporting pins. Then, the substrate holding device 30 delivers the wafer W mounted on the non-illustrated supporting pins onto the substrate transfer device 111.

The liquid supply unit 40_1 includes nozzles 41a to 41c, an arm 42 and a rotating/elevating device 43.

A DHF supply source 45a is connected to the nozzle 41a via a valve 44a; a DIW supply source 45b is connected to the nozzle 41b via a valve 44b; and an IPA supply source 45c is connected to the nozzle 41c via a valve 44c. A DHF supplied from the nozzle 41a is a dilute hydrofluoric acid which is diluted to a preset concentration that does not cause corrosion of the Cu wiring 102. Further, the arm 42 is configured to support the nozzles 41a to 41c horizontally, and the rotating/elevating device 43 is configured to rotate and move the arm 42 up and down.

The liquid supply unit 40_1 is configured to supply, onto the wafer W, a preset chemical liquid (here, DHF) from the nozzle 41a, DIW (pure water) as a kind of rinse liquid from the nozzle 41b, and IPA (isopropyl alcohol) as a kind of drying solvent from the nozzle 41c.

Further, the liquid supply unit 40_2 includes nozzles 41d and 41e, an arm 42 configured to support the nozzles 41d and 41e horizontally; and a rotating/elevating device 43 configured to rotate and move the arm 42 up and down. A MIBC supply source 45d is connected to the nozzle 41d via a valve 44d, and a topcoat liquid supply source 45e is connected to the nozzle 41e via a valve 44e.

The liquid supply unit 40_2 is configured to supply MIBC (4-methyl-2-pentanol) as a solvent having affinity with the topcoat liquid onto the wafer W from the nozzle 41d, and supply the topcoat liquid onto the wafer W from the nozzle 41e.

The MIBC is also contained in the topcoat liquid and has affinity with the topcoat liquid. Besides the MIBC, PGME (propylene glycol monomethyl ether), PGMEA (Propylene glycol monomethyl ether acetate), or the like may be used as the solvent having affinity with the topcoat liquid.

Further, although the dedicated nozzles 41a to 41e are provided for the respective processing liquids in this example embodiment, a single nozzle may be shared for the multiple the processing liquids. If the nozzle is shared, however, a processing liquid remaining in the nozzle or a pipeline needs to be first discharged out in a case where the processing liquids are required not to be mixed, for example. Accordingly, the corresponding processing liquid may be consumed unnecessarily. In contrast, by providing the dedicated nozzles 41a to 41e, such a process of discharging the processing liquid need not be performed, so that waste of the processing liquid can be avoided.

The collecting cup 50 is provided to surround the rotating/holding unit 31 and is configured to collect a processing liquid dispersed from the wafer W by the rotation of the rotating/holding unit 31. A liquid drain opening 51 is formed at a bottom of the collecting cup 50, and the processing liquid collected by the collecting cup 50 is drained out from the liquid drain opening 51 to an outside of the first liquid processing unit 14. Further, a gas exhaust opening 52, through which the $N_2$ gas supplied from the fluid supply unit 32 or the inert gas supplied from the FFU 21 is exhausted to the outside of the first liquid processing unit 14, is also formed at the bottom of the collecting cup 50.

<Configuration of Second Liquid Processing Unit>

Figure 7:
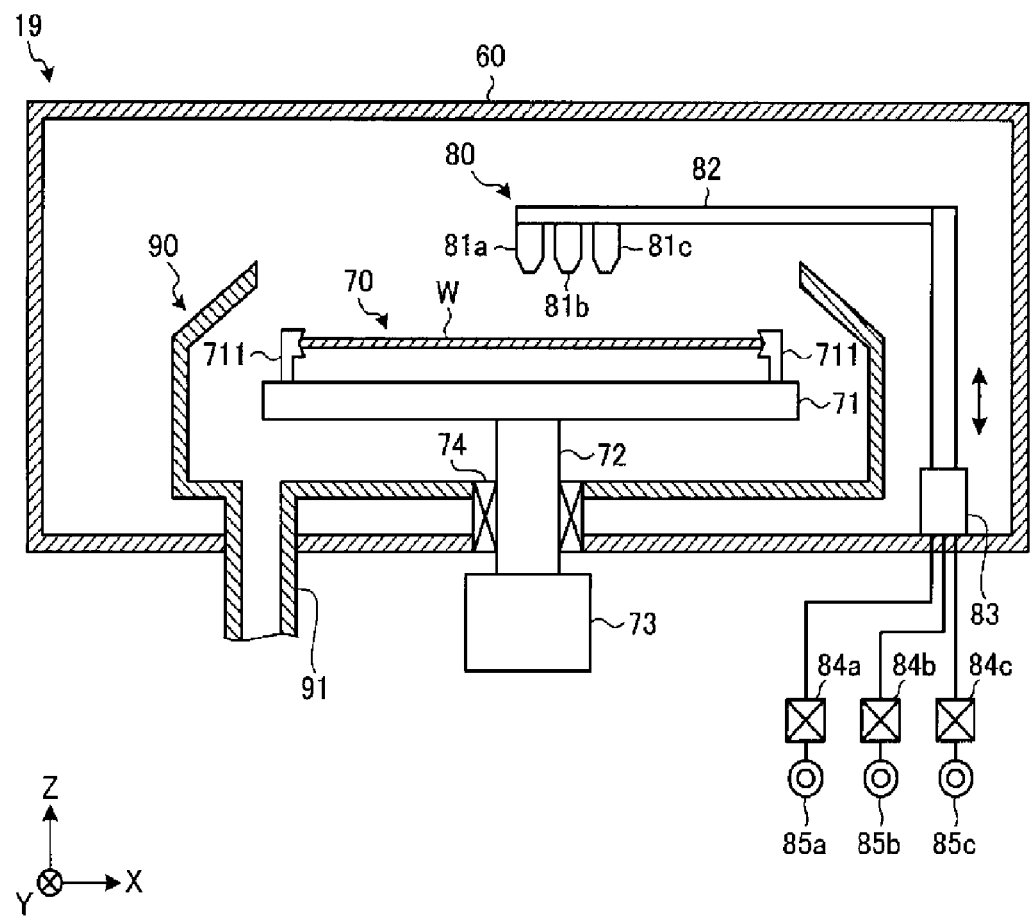
FIG. 7 is a schematic diagram depicting an example configuration of a second liquid processing unit.

Now, a configuration of the second liquid processing unit 19 included in the second processing apparatus 3 will be described with reference to FIG. 7. FIG. 7 is a schematic diagram depicting an example configuration of the second liquid processing unit 19.

As depicted in FIG. 7, the second liquid processing unit 19 includes, within a chamber 60, a substrate holding device 70, a liquid supply unit 80 and a collecting cup 90.

The substrate holding device 70 has a rotating/holding unit 71, a supporting column 72 and a driving unit 73. The rotating/holding unit 71 is provided at a substantially central portion of the chamber 60. A holding member 711 configured to hold a wafer W from a lateral side thereof is provided on a top surface of the rotating/holding unit 71. The wafer W is horizontally held by the holding member 711 while slightly spaced apart from the top surface of the rotating/holding unit 71. The supporting column 72 is a vertically extended member. A base end of the supporting column 72 is rotatably supported by the driving unit 73, and a leading end of the supporting column 72 is configured to horizontally support the rotating/holding unit 71. The driving unit 73 is configured to rotate the supporting column 72 about a vertical axis.

The substrate holding device 70 configured as described above rotates the rotating/holding unit 71, which is supported on the supporting column 72, by rotating the supporting column 72 through the driving unit 73, so that the wafer W held on the rotating/holding unit 71 is also rotated.

The liquid supply unit 80 includes nozzles 81a to 81c, an arm 82 and a rotating/elevating device 83.

The nozzle 81a is connected to a DHF supply source 85a via a valve 84a, the nozzle 81b is connected to an alkali developer supply source 85b via a valve 84b, and the nozzle 81c is connected to a DIW supply source 85c via a valve 84c. The arm 82 is configured to horizontally support the nozzles 81a to 81c. The rotating/elevating device 83 is configured to rotate and move the arm 82 up and down.

The liquid supply unit 80 is configured to supply, onto the wafer W, a DHF as a preset chemical liquid from the nozzle 81a, the alkali developer as the removing liquid for removing the topcoat film from the nozzle 81b, and the DIW as the rinse liquid from the nozzle 81c.

The alkali developer supplied from the nozzle 81b contains an anticorrosive material that suppresses corrosion of the Cu wiring 102. Accordingly, it is possible to remove the topcoat film while suppressing damage on the Cu wiring 102 in a removing liquid supplying process to be described later. Further, the DHF supplied from the nozzle 81a is diluted to a preset concentration that does not incur corrosion of the Cu wiring 102.

The collecting cup 90 is placed to surround the rotating/holding unit 71 to suppress the processing liquids from being dispersed. A liquid drain opening 91 is formed at a bottom of the collecting cup 90, and the processing liquids collected by the collecting cup 90 are drained out of the second liquid processing unit 19 from the liquid drain opening 91.

As described above, the second liquid processing unit 19 in accordance with the first example embodiment corresponds to a removing unit configured to remove the topcoat film from the wafer W and, also, an example post-treatment unit configured to perform a preset post-treatment on the wafer W from which the topcoat film has been removed.

<Operations of Substrate Processing System>

Now, specific operations of the substrate processing system 1 will be discussed with reference to FIG. 8. FIG. 8 is a flowchart showing a process sequence of processing the substrate in accordance with the first example embodiment. Respective processes shown in FIG. 8 are performed under the control of the first control device 4A or the second control device 4B.

In the substrate processing system 1 in accordance with the first example embodiment, processes from a dry etching process (block S101) to a first unloading process (block S107) shown in FIG. 8 are performed in the first processing apparatus 2, and processes from a removing liquid supplying process (block S108) to a second unloading process (block S110) are performed in the second processing apparatus 3.

As shown in FIG. 8, at block S101 (Dry Etching Process), the dry etching process is performed in the dry etching unit. In this dry etching process, the dry etching unit 12 performs a dry etching or aching on a wafer W. As a result, a Cu wiring 102 formed within the wafer W is exposed (see FIG. 1A).

Then, the wafer W is loaded into the first liquid processing unit 14. Since this loading process is performed through the load lock chamber 13, the exposed Cu wiring 102 can be suppressed from being oxidized. Processing may proceed from block S101 to block S102.

Subsequently, at block S102 (Chemical Liquid Process), a chemical liquid process is performed in the first liquid processing unit 14. In this chemical liquid process, the nozzle 41a of the liquid supply unit 40_1 (see FIG. 6) is positioned above a central portion of the wafer W, and a DHF is supplied onto the wafer W from the nozzle 41a. The DHF supplied to the wafer W is diffused on a main surface of the wafer W by a centrifugal force generated by rotation of the wafer W.

Accordingly, a surface of a reaction product P or the Cu wiring 102 is slightly dissolved by the DHF, and an adhesive strength of the reaction product P is weakened. Thus, the reaction product P becomes easily removable.

Here, the chemical liquid process of block S102 is performed to easily remove the reaction product P, and is performed under a low etching condition where the reaction product P may not be completely removed. Here, the term "low etching condition" means a condition for performing etching with, for example, an etching time shorter than an etching time required to completely remove the reaction product P, or a DHF concentration lower than a DHF concentration required to completely remove the reaction product P.

Thus, as compared to the conventional case of removing the reaction product P only with the DHF, it is possible to remove the reaction product P more effectively while suppressing the Cu wiring 102 from being damaged. Further, since the DHF supplied from the nozzle 41a in the first example embodiment is diluted to a preset concentration that does not incur corrosion of the Cu wiring 102, damage on the Cu wiring 102 may be more securely suppressed.

A reaction product P having a relatively smaller particle size may be easily removed in the chemical liquid process, whereas a reaction product P having a relatively larger particle size may be easily removed in a removing process using a topcoat liquid and an alkali removing liquid to be described later. Accordingly, through the combination of these two types of processes, it is possible to remove the reaction product P more effectively.

The chemical liquid supplied from the nozzle 41*a* may not be limited to the DHF. By way of non-limiting example, ammonium fluoride, hydrochloric acid, sulfuric acid, hydrogen peroxide water, phosphoric acid, acetic acid, nitric acid, ammonium hydroxide, organic acid, an aqueous liquid containing ammonium fluoride, or the like may be used as the chemical liquid. Processing may proceed from block S102 to block S103.

Subsequently, in the first liquid processing unit 14, at block S103 (Rinsing Process), a rinsing process of cleaning the main surface of the wafer W with DIW is performed. In this rinsing process, the nozzle 41*b* (see FIG. 6) is positioned above the central portion of the wafer W. Thereafter, the valve 44*b* is opened for a preset time, so that the DIW is supplied from the nozzle 41*b* onto the main surface of the wafer W being rotated, and the DHF remaining on the wafer W is washed away. Processing may proceed from block S103 to block S104.

Thereafter, at block S104 (Substitution Process), a substitution process is performed in the first liquid processing unit 14. In this substitution process, the nozzle 41*c* (see FIG. 6) is positioned above the central portion of the wafer W. Then, the valve 44*c* is opened for a preset time, so that IPA is supplied from the nozzle 41*c* onto the main surface of the wafer W being rotated, and the DIW on the wafer W is substituted with the IPA. Then, the rotation of the wafer W is stopped while the IPA remains on the wafer W. Upon the completion of the substitution process, the liquid supply unit 40_1 is moved to the outside of the wafer W. The processes from blocks S102 to S104 may not necessarily be performed. Processing may proceed from block S104 to block S105.

Subsequently, at block S105 (Solvent Supplying Process), a solvent supplying process is performed in the first liquid processing unit 14. The solvent supplying process is a process of supplying MIBC having affinity with the topcoat liquid onto the wafer W before supplying the topcoat liquid as a film forming liquid onto the wafer W.

To elaborate, the nozzle 41*d* of the liquid supply unit 40_2 is positioned above the central portion of the wafer W. Then, the MIBC is supplied onto the wafer W from the nozzle 41*d*. The MIBC supplied on the wafer W is diffused on the main surface of the wafer W by the centrifugal force generated by the rotation of the wafer W.

In this way, by diffusing the MIBC having affinity with the topcoat liquid on the wafer W in advance, the topcoat liquid may be easily diffused on the wafer W and easily enter the via hole 106 in a subsequent film forming liquid supplying process to be described later. Accordingly, a consumption amount of the topcoat liquid can be decreased, and the reaction product P within the via hole 106 can be more securely removed.

The MIBC has high affinity with the topcoat liquid, whereas the MIBC is hardly mixed with DIW and has low affinity with the DIW. Thus, in the first liquid processing unit 14, prior to supplying the MIBC, the DIW is substituted with the IPA having higher affinity with the MIBC than the DIW.

Accordingly, as compared to a case of performing the solvent supplying process (block S105) immediately after the rinsing process (block S103), the MIBC is allowed to be more easily diffused on the main surface of the wafer W. Therefore, a consumption amount of the MIBC can be decreased.

Further, in case that a solvent having affinity with the film forming liquid has affinity with the DIW as well, the substitution process of block S104 may be omitted.

As stated above, it is desirable to perform the above-described solvent supplying process, for example, to diffuse the topcoat liquid on the top surface of the wafer W efficiently for a short time period. Further, if the film forming liquid has affinity with the IPA, the solvent supplying process of block S105 may be omitted. Processing may proceed from block S105 to block S106.

Thereafter, at block S106 (Film Forming Liquid Supplying Process), the film forming liquid supplying process is performed in the first liquid processing unit 14. In this film forming liquid supplying process, the nozzle 41*e* of the liquid supply unit 40_2 is positioned above the central portion of the wafer W. Then, the topcoat liquid as a film forming liquid is supplied from the nozzle 41*e* onto the main surface of the wafer W, which serves as a surface on which a circuit is formed and no resist film is formed.

The topcoat liquid supplied on the wafer W is diffused on the main surface of the wafer W by the centrifugal force generated by the rotation of the wafer W. As a result, a liquid film of the topcoat liquid is formed on the entire main surface of the wafer W (see FIG. 1B). At this time, the wettability of the main surface of the wafer W has been increased by supplying the MIBC on the wafer W at block S105. Thus, the topcoat liquid can be easily diffused on the main surface of the wafer W, and can enter the via hole 106 more easily. Therefore, the consumption amount of the topcoat liquid can be reduced, and a processing time can also be shortened.

As a volatile component is volatilized when the wafer W is rotated, the topcoat liquid is solidified or cured. As a result, a topcoat film is formed on the entire main surface of the wafer W.

Further, a volatilization accelerating process is performed in the first liquid processing unit 14. This volatilization accelerating process is a process of accelerating the volatilization of the volatile component contained in the topcoat liquid for forming the film on the entire main surface of the wafer W. To be specific, by opening the valve 33 (see FIG. 6) for a preset time, a high-temperature $N_2$ gas is supplied from the fluid supply unit 32 to the rear surface of the wafer W being rotated. As a consequence, the topcoat liquid is heated along with the wafer W, so that the volatilization of the volatile component can be accelerated.

Alternatively, the volatilization accelerating process may be a process of depressurizing the inside of the chamber 20 by a non-illustrated depressurizing device or a process of decreasing humidity within the chamber 20 by a gas supplied from the FFU 21. The volatilization of the volatile component can also be accelerated through these processes.

Here, though the present example embodiment is described for the case of performing the volatilization accelerating process in the first liquid processing unit 14, the volatilization accelerating process may be omitted. That is, the wafer W may be left in the first liquid processing unit 14 until the topcoat liquid is naturally solidified or cured. Further, by rotating the wafer W at a rotational speed that does not make the topcoat liquid dispersed off the wafer W and does not expose the main surface of the wafer W or does not stop the rotating of the wafer W, the volatilization of the topcoat liquid may be accelerated. Processing may proceed from block S106 to block S107.

Subsequently, at block S107 (First Unloading Process), a first unloading process is performed in the first liquid processing unit 14. In this first unloading process, the substrate transfer device 111 takes out the wafer W from the first liquid processing unit 14, and then, transfers the wafer W onto the mounting unit 10 to accommodate the wafer W in the carrier C mounted on the mounting unit 10.

At this time, the exposed Cu wiring 102 of the wafer W is covered with the topcoat liquid in a short time period after the dry etching (see FIG. 1C). That is, since the Cu wiring 102 is blocked from the exterior air, an adverse effect on the wafer W, such as oxidation thereof, may be avoided.

Accordingly, in the substrate processing system 1 of the first example embodiment, since time management for keeping the Q-time from the end of the dry etching to the cleaning process becomes unnecessary, productivity can be improved.

The wafer W accommodated in the carrier C is transferred from the first processing apparatus 2 to the mounting unit 16 of the second processing apparatus 3. Thereafter, the wafer W is taken out of the carrier C by the substrate transfer device 171 (see FIG. 4) of the second processing apparatus 3, and then, loaded into the second liquid processing unit 19 via the transit unit 172 and the substrate transfer device 181. Processing may proceed from block S107 to block S108.

In the second liquid processing unit 19, at block S108 (Removing Liquid Supplying Process), a removing liquid supplying process is performed first. In the removing liquid supplying process, the nozzle 81b (see FIG. 7) is positioned above the central portion of the wafer W. Then, the valve 84b is opened for a preset time, and the alkali developer as a removing liquid is supplied from the nozzle 81b onto the wafer W being rotated. As a result, the topcoat film formed on the wafer W is peeled off and dissolved to be removed from the wafer W.

At this time, the reaction product P remaining on the wafer W is peeled off and removed from the wafer W. At the moment, since zeta potentials having the same polarity are generated on the wafer W and the reaction product P, the wafer W and the reaction product P are repelled against each other. Thus, re-attachment of the reaction product P to the wafer W or the like can be suppressed.

Further, the alkali developer contains an anticorrosive material that suppresses corrosion of the Cu wiring 102. Accordingly, corrosion of the Cu wiring 102 can be suppressed even when the alkali developer is supplied on the Cu wiring 102. Thus, in accordance with the substrate processing system 1 of the first example embodiment, it is possible to remove the topcoat film while suppressing the Cu wiring 102 from being damaged. Processing may proceed from block S108 to block S109.

Subsequently, at block S109 (Chemical Liquid Process), a chemical liquid process is performed in the second liquid processing unit 19. In this chemical liquid process, the nozzle 81a (see FIG. 7) is positioned at the central portion of the wafer W, and the DHF is supplied onto the wafer W from the nozzle 81a. The DHF supplied on the wafer W is diffused on the main surface of the wafer W by the centrifugal force generated by the rotation of the wafer W.

In this way, by performing the chemical liquid process after the removing liquid supplying process, i.e., after removing the topcoat film, it is possible to remove the reaction product P (especially, a reaction product P having a relatively smaller particle size), if any, which may still remain on the wafer W without being removed when the topcoat film is peeled off. Even in such a case, it is possible to remove the reaction product P more effectively while suppressing damage on the wafer W, as compared to a general chemical liquid cleaning process. Further, if the reaction product P is removed sufficiently by the removing liquid supplying process, the chemical liquid process of block S109, i.e., the wet cleaning process may be omitted.

Upon the completion of the chemical liquid process, there is performed a rinsing process of cleaning the main surface of the wafer W by supplying the DIW onto the wafer W from the nozzle 81c in the second liquid processing unit 19. Through this rinsing process, the dissolved topcoat film or the reaction product P floating in the alkali developer are washed away by the DIW from the wafer W. After the rinsing process, in the second liquid processing unit 19, there is performed a drying process of drying the wafer W by increasing the rotational speed of the wafer W for a preset time period to disperse the DIW remaining on the main surface of the wafer W. Thereafter, the rotation of the wafer W is stopped. Processing may proceed from block S109 to block S110.

Then, at block S110 (Second Unloading Process), a second unloading process is performed in the second liquid processing unit 19. In this second unloading process, the wafer W is unloaded from the second liquid processing unit 19 by the substrate transfer device 181 (see FIG. 4), and then, accommodated in the carrier C mounted on the mounting unit 16 via the transit unit 172 and the substrate transfer device 171. Upon the completion of the second unloading process, a series of substrate processes on the single sheet of wafer W is finished.

As described above, the substrate processing system 1 in accordance with the first example embodiment includes the mounting unit 10, the liquid supply unit 40_2 (corresponding to the example processing liquid supply unit), and the substrate transfer device 111. The mounting unit 10 is configured to mount thereon carriers C each of which is capable of accommodating therein a multiple number of wafers W. The liquid supply unit 40_2 is configured to supply the topcoat liquid, which contains a volatile component and is used as a processing liquid for forming a film on the wafer W, after performing the dry etching or aching on the wafer W in which a Cu wiring 102 is formed and at least a part thereof is exposed. The substrate transfer device 111 transfers, to the mounting unit 10, the wafer W having thereon the topcoat liquid solidified or cured as a result of the volatilization of the volatile component, and then accommodates the wafer W in the carrier C mounted on the mounting unit 10.

Accordingly, in accordance with the substrate processing system 1 of the first example embodiment, the Q-time from the exposure of the Cu wiring 102 to the cleaning process is easily managed, so that productivity may be improved.

Second Example Embodiment

Meanwhile, in a semiconductor manufacturing process, a rear surface process such as cleaning on a rear surface of a wafer W may be performed. In such a case, however, there is a concern that a cleaning liquid used in the rear surface process may be dispersed to or infiltrated into a main surface of the wafer W, so that the main surface of the wafer W is contaminated.

Accordingly, by forming a topcoat film on the main surface of the wafer W and then performing the rear surface process of the wafer W in the state that the main surface of the wafer W is protected by the topcoat film, the contamination of the main surface of the wafer W may be suppressed.

This process will be described below with reference to FIG. 9A and FIG. 9B. FIG. 9B and FIG. 9B illustrate an example rear surface cleaning process.

Figure 9A:
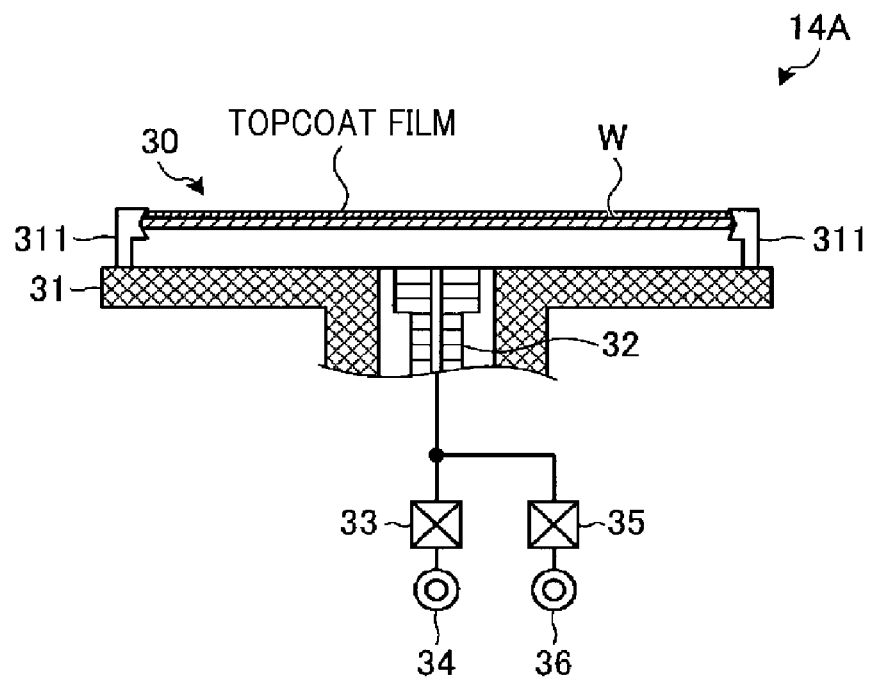
FIG. 9A is a diagram showing an example of a rear surface cleaning process.
Figure 9B:
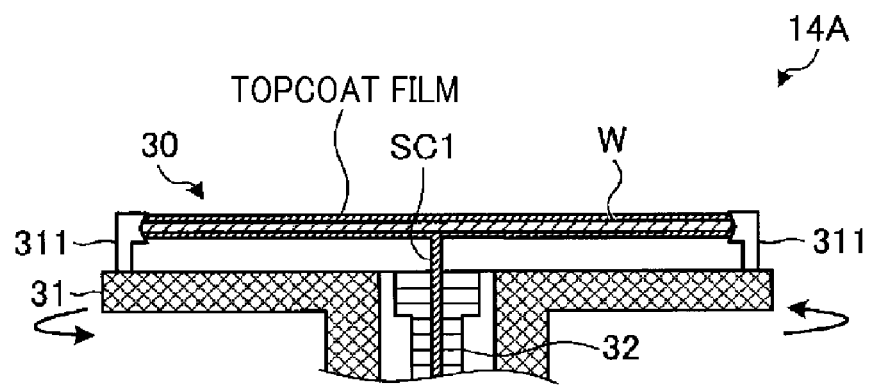
FIG. 9B is a diagram showing an example of the rear surface cleaning process

As illustrated in FIG. 9A, a fluid supply unit 32 included in a first liquid processing unit 14A is connected to an $N_2$ supply source 34 via a valve 33 and also connected to a SC1 supply source 36 via a valve 35. The fluid supply unit 32 is configured to supply an $N_2$ gas introduced from the $N_2$ supply source 34 to the rear surface of the wafer W and, also, supply SC1 (ammonia hydrogen peroxide water) introduced from the SC1 supply source 36 to the rear surface of the wafer W.

The first liquid processing unit 14A is configured to perform the rear surface cleaning process depicted in FIG. 9B after the process of block S106 shown in FIG. 8 is performed, i.e., after a topcoat film is formed on the entire main surface of the wafer W.

In the rear surface cleaning process, the valve 35 is opened for a preset time, and the SC1 is supplied from the fluid supply unit 32 to the rear surface of the wafer W being rotated. As a result, the rear surface of the wafer W is cleaned.

As described, in this second example embodiment, the rear surface of the wafer W is cleaned in the state that the entire main surface of the wafer W is covered with the topcoat film. Accordingly, even if the cleaning liquid is dispersed during the rear surface cleaning process, the dispersed cleaning liquid may be suppressed from adhering to the main surface of the wafer W, so that the contamination of the main surface of the wafer W can be suppressed. Furthermore, contamination of the main surface of the wafer W as a result of infiltration of the cleaning liquid may also be suppressed.

Although FIG. 9A and FIG. 9B depict an example case of performing the rear surface cleaning process by supplying the cleaning liquid such as SC1 to the rear surface of the wafer W, the rear surface cleaning process may not be limited thereto. For example, a scrub cleaning using a cleaning member such as a brush may be performed as the rear surface cleaning process.

Figure 10:
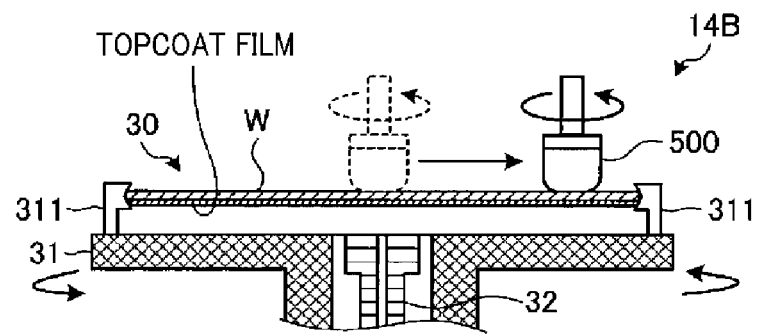
FIG. 10 is a diagram illustrating another example of the rear surface cleaning process.

An example case of performing the scrub cleaning as the rear surface cleaning process will be described below with reference to FIG. 10. FIG. 10 is a diagram illustrating such another example rear surface cleaning process.

When performing the scrub cleaning as the rear surface cleaning process, a first liquid processing unit 14B shown in FIG. 10 first carries out processes of blocks S101 to S106 shown in FIG. 8.

Subsequently, the wafer W is taken out of the first liquid processing unit 14B by the substrate transfer device 111, and then, transferred to a non-illustrated inverting device. After front and rear surfaces of the wafer W are inverted by the inverting device, the wafer W is loaded again into the first liquid processing unit 14B by the substrate transfer device 111. By way of example, the inverting device may be provided in the processing station 6 of the first processing apparatus 2. As for the inverting device, any of various known configurations may be employed.

Subsequently, as illustrated in FIG. 10, the first liquid processing unit 14B holds and rotates the inverted wafer W by a substrate holding device 30 and, then, performs the scrub cleaning on the rear surface of the wafer W by using a brush 500. Specifically, by moving the rotating brush 500 while maintaining the brush 500 in contact with the rear surface of the wafer W, the first liquid processing unit 14B removes foreign substances adhering to the wafer W.

At this time, since the entire main surface of the wafer W is covered with the topcoat film, the foreign substances removed from the rear surface of the wafer W may not be attached to the main surface of the wafer W. Here, a fluid such as an $N_2$ gas from the fluid supply unit 32 may be supplied, so that the foreign substances can be suppressed from adhering to the topcoat film.

Upon the completion of the scrub cleaning, the wafer W is unloaded from the first liquid processing unit 14B by the substrate transfer device 111, inverted again by the non-illustrated inverting device, and then, accommodated in the carrier C.

Here, although the brush 500 is used, the scrub cleaning may be performed by using other cleaning members such as a sponge.

Figure 11:
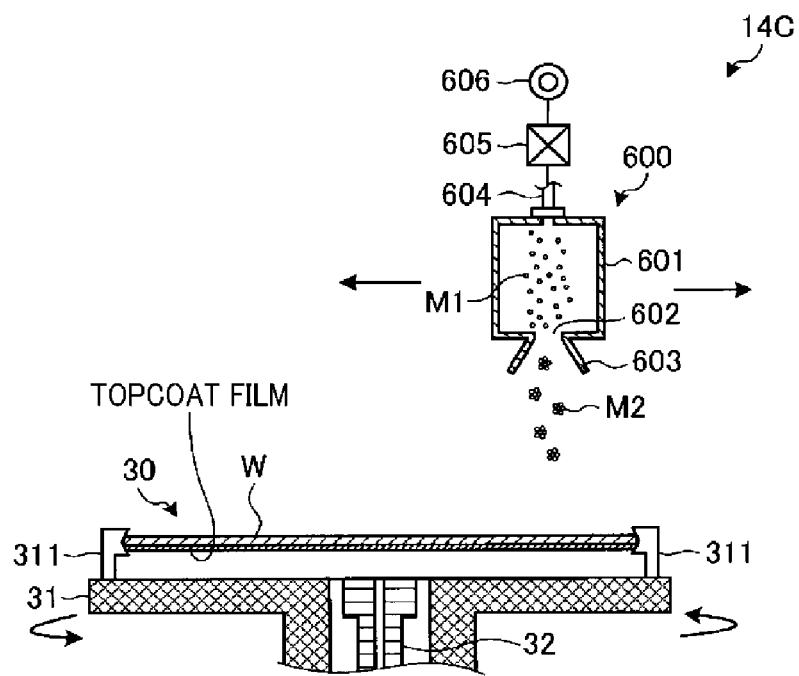
FIG. 11 is a diagram illustrating still another example of the rear surface cleaning process.

In addition, a process of jetting a gas cluster to the rear surface of the wafer W to remove particles from the rear surface of the wafer W may be performed as the rear surface cleaning process. This process will be described below with reference to FIG. 11. FIG. 11 illustrates such a still another example rear surface cleaning process.

As illustrated in FIG. 11, a first liquid processing unit 14C includes a nozzle 600. The nozzle 600 is configured to jet carbon dioxide as a cleaning gas at a high pressure and configured to generate a gas cluster, which is an aggregate of atoms or molecules of the cleaning gas, by adiabatic expansion.

The nozzle 600 includes a pressure chamber 601 formed in, for example, a substantially cylindrical shape of which bottom portion is opened. The bottom portion of the pressure chamber 601 is formed to have an orifice 602. A gas diffuser 603 of which diameter increases downward is connected to the orifice 602. At the orifice 602, an opening diameter is, e.g., about 0.1 mm.

One end of a gas supply path 604 is connected to a top portion of the pressure chamber 601, and a carbon dioxide supply source 606 is connected to the other end of the gas supply path 604 via a pressure control valve 605.

The first liquid processing unit 14C is configured to invert the wafer W having the topcoat film formed thereon and, then, rotate the wafer W while holding the wafer W on the substrate holding device 30 in the same process sequence as that in the case of performing the above-described scrub cleaning. Further, the first liquid processing unit 14C is configured to supply carbon dioxide to the nozzle 600 at a higher pressure than a pressure within the chamber 20 of the first liquid processing unit 14C. Once jetted from the nozzle 600 into the chamber 20, the carbon dioxide is cooled to be a temperature equal to or lower than a condensation temperature by rapid adiabatic expansion, and molecules M1 thereof are agglomerated together into gas clusters M2, which are the aggregates, by a van der Waals force.

The gas clusters M2 are vertically jetted toward the rear surface of the wafer W, and may blow away and remove foreign substances attached on the rear surface of the wafer W. Here, the entire main surface of the wafer W is covered with the topcoat film. Accordingly, the foreign substances removed from the rear surface of the wafer W may be suppressed from adhering to the main surface of the wafer W.

After the cleaning by the gas clusters M2 is completed, the wafer W is unloaded from the first liquid processing unit 14C by the substrate transfer device 111, inverted once again by the non-illustrated inverting device, and, then, accommodated in the carrier C.

Alternatively, the rear surface cleaning process may be implemented by a two-fluid cleaning process using a two-fluid nozzle configured to jet a cleaning liquid to the rear surface of the wafer W in a mist form by a gas, an ultrasonic cleaning process using an ultrasonic oscillator, or the like.

In addition, the process performed in the state that the main surface of the wafer W is covered with the topcoat film may not be limited to the rear surface cleaning process, and may be, by way of example, an etching process of etching a rear surface or a bevel of the wafer W by using a chemical liquid. Here, the etching process may be a process of removing an oxide film by using, for example, hydrofluoric acid (HF) or the like. Since the etching process is performed in the state that the main surface of the wafer W is covered with the topcoat film, the main surface of the wafer W may not be etched by being protected by the topcoat film even if the chemical liquid infiltrates from the rear surface of the wafer W toward the main surface thereof. As described, since an area to be etched is determined by the topcoat film, the etching process can be performed with high accuracy.

In addition, the process performed in the state that the main surface of the wafer W is covered with the topcoat film may also be a polishing process of polishing the rear surface or the bevel of the wafer W by using a polishing brush.

As stated above, by processing the other surface of the wafer W in the state that the main surface of the wafer W is covered with the topcoat film, the other surface of the wafer W can be processed while suppressing the main surface of the wafer W from being contaminated.

The above second example embodiment has been described for the case where each of the first liquid processing units 14A to 14C corresponds to an example other surface processing unit. That is, the second example embodiment has been described for the case where the first liquid processing units 14A to 14C perform the rear surface cleaning process as well as a film forming liquid supplying process. However, the first processing apparatus 2 may additionally include a rear surface cleaning unit configured to perform the rear surface cleaning process, separately from the first liquid processing unit 14.

In addition, the other surface process such as the rear surface cleaning process may be performed in the second processing apparatus 3. In this case, a nozzle or a brush for the rear surface cleaning may be provided in the second liquid processing unit 19, or a rear surface processing unit, which is separate from the second liquid processing unit 19, may be additionally provided in the second processing apparatus 3.

Third Example Embodiment

Figure 12:
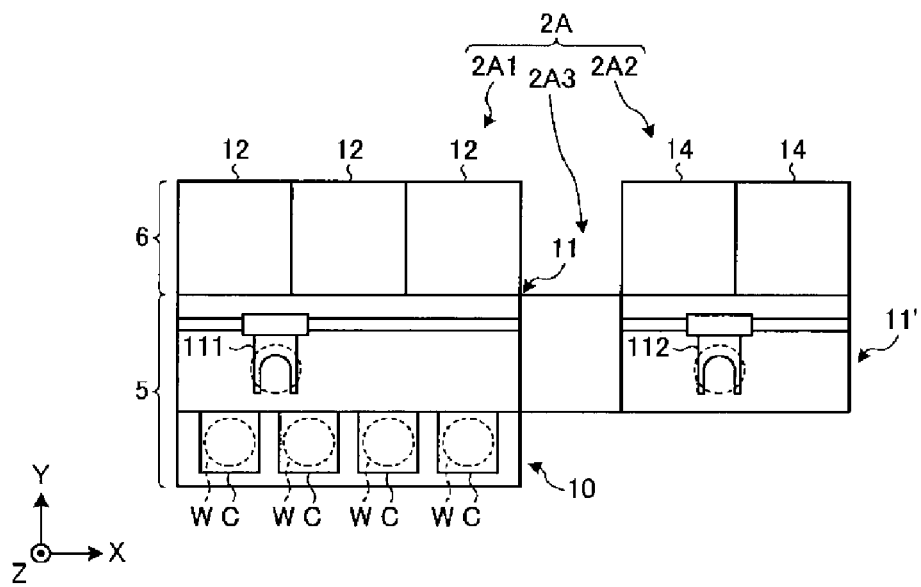
FIG. 12 is a diagram depicting a schematic configuration of a first processing apparatus in accordance with a third example embodiment.

Further, the configurations for performing the film forming liquid supplying process or the removing liquid supplying process may be additionally provided in a conventional pre-treatment or post-treatment apparatus which does not have these configurations. In a third example embodiment, such a configuration will be described. FIG. 12 is a diagram depicting a schematic configuration of a first processing apparatus in accordance with the third example embodiment.

As illustrated in FIG. 12, the first processing apparatus 2A includes a first block 2A1, a second block 2A2, and a connecting unit 2A3.

The first block 2A1 includes a loading/unloading station 5 and a processing station 6. Since the loading/unloading station 5 is the same as the aforementioned loading/unloading station 5 of the first processing apparatus 2 in accordance with the first example embodiment, specific elaboration thereof is omitted herein.

A multiple number of dry etching units 12 are arranged in the processing station 6 of the first block 2A1. In addition, unlike the processing station 6 of the first processing apparatus 2 in the first example embodiment, the processing station 6 of the first block 2A1 does not include the first liquid processing unit 14.

The second block 2A2 includes a transfer unit 11' and a multiple number of first liquid processing units 14. The transfer unit 11' includes a substrate transfer device 112, which is the same as the substrate transfer device 111, and performs the loading/unloading of a wafer W into/from the first liquid processing units 14 by using the substrate transfer device 112.

The connecting unit 2A3 is configured to connect the transfer unit 11 of the first block 2A1 and the transfer unit 11' of the second block 2A2 to each other. This connecting unit 2A3 has an internal space blocked from the atmosphere. The internal space is filled with an inert gas such as an $N_2$ gas and blocked from the atmosphere. Further, a non-illustrated mounting table is provided in the internal space.

In this first processing apparatus 2A, after a process in a dry etching unit 12 is finished, the wafer W is taken out of the dry etching unit 12 by the substrate transfer device 111, and, then, mounted on the non-illustrated mounting table of the connecting unit 2A3.

The wafer W mounted on the mounting table is taken out of the mounting table by the substrate transfer device 112 of the second block 2A2, and then, transferred into a corresponding first liquid processing unit 14 in which the processes of blocks S102 to S106 shown in FIG. 8 are performed. As a result, a topcoat film is formed on a main surface of the wafer W.

Thereafter, the wafer W is taken out of the first liquid processing unit 14 by the substrate transfer device 112, transferred from the substrate transfer device 112 to the substrate transfer device 111 via the non-illustrated mounting table of the connecting unit 2A3, and, then, accommodated in the carrier C mounted on the mounting unit 10 by the substrate transfer device 111.

As described, the first liquid processing unit 14 configured to perform a film forming liquid supplying process may be provided separately from the first block 2A1 including the mounting unit 10, the substrate transfer device 111 and the dry etching unit 12, and the first liquid processing unit 14 may be provided in the second block 2A2 connected to the first block 2A1 via the connecting unit 2A3. That is, the first liquid processing unit 14 may be additionally provided in the conventional pre-treatment apparatus which does not have the first liquid processing unit 14.

In this case, by blocking the internal space of the connecting unit 2A3 from the atmosphere, the Cu wiring 102 exposed by the dry etching can be suppressed from being oxidized when the wafer W is transferred from the first block 2A1 to the second block 2A2 after the dry etching.

In addition, like the internal space of the connecting unit 2A3, the inside of the transfer unit 11 of the first block 2A1 and the inside of the transfer unit 11' of the second block 2A2 may also be filled with an $N_2$ gas or the like, and thus, blocked from the atmosphere. In this configuration, the exposed Cu wiring 102 can be further suppressed from being oxidized.

In addition, in the above-described third example embodiment, the transfer unit 11 of the first block 2A1 and the transfer unit 11' of the second block 2A2 are connected to each other by the connecting unit 2A3. However, the first processing apparatus 2A may have, for example, a configuration in which the dry etching unit 12 of the first block 2A1 and the first liquid processing unit 14 of the second block 2A2 are connected to each other by the connecting unit 2A3. In such a configuration, a non-illustrated substrate transfer device may be provided in the internal space of the connecting unit 2A3, and the wafer W may be transferred between the dry etching unit 12 and the first liquid processing unit 14 by the non-illustrated substrate transfer device. In addition, in this configuration, the second block 2A2 does not need to include the transfer unit 11'.

Figure 13:
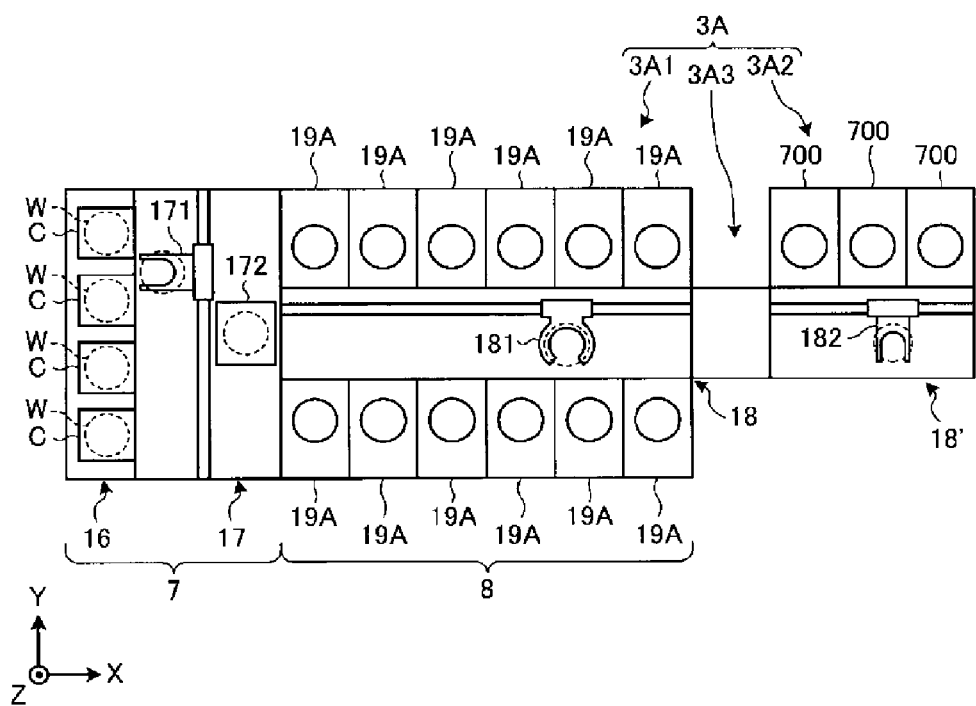
FIG. 13 is a diagram depicting a schematic configuration of a second processing apparatus in accordance with the third example embodiment.

Now, a modification example of the second processing apparatus will be described with reference to FIG. 13. FIG. 13 is a diagram depicting a schematic configuration of a second processing apparatus in accordance with the third example embodiment.

As depicted in FIG. 13, the second processing apparatus 3A includes a first block 3A1, a second block 3A2, and a connecting unit 3A3.

The first block 3A1 includes a loading/unloading station 7 and a processing station 8. The loading/unloading station 7 is the same as the loading/unloading station 7 of the second processing apparatus 3 in accordance with the first example embodiment.

A multiple number of second liquid processing units 19A are arranged in the processing station 8 of the first block 3A1. Each second liquid processing unit 19A has the same configuration as that of each second liquid processing unit 19 of the first example embodiment excepting that the components related to a removing liquid supplying process, specifically, the nozzle 81b, the valve 84b and the alkali developer supply source 85b are omitted in the second liquid processing unit 19A.

The second block 3A2 includes a transfer unit 18' and a multiple number of removing units 700. The transfer unit 18' includes a substrate transfer device 182, which is the same as the substrate transfer device 181. Loading/unloading of the wafer W into/from the removing units 700 are performed by using the substrate transfer device 182.

The removing units 700 have the configuration excluding the nozzle 81a, the valve 84a, the DHF supply source 85a, the nozzle 81c, the valve 84c and the DIW supply source 85c, from the second liquid processing units 19 in accordance with the first example embodiment.

The connecting unit 3A3 connects the transfer unit 18 of the first block 3A1 and the transfer unit 18' of the second block 3A2 to each other. This connecting unit 3A3 has an internal space blocked from the atmosphere. The internal space is blocked from the atmosphere by being filled with an inert gas such as, but not limited to, an $N_2$ gas. In addition, a non-illustrated mounting table is provided in the internal space.

In this second processing apparatus 3A, the wafer W is transferred from the loading/unloading station 7 to the transfer unit 18 of the processing station 8, and, then, mounted on the non-illustrated mounting table of the connecting unit 3A3 by the substrate transfer device 181.

The wafer W mounted on the mounting table is taken out of the mounting table by the substrate transfer device 182 of the second block 3A2, and, then, transferred to a corresponding removing unit 700 in which the removing liquid supplying process (block S108 of FIG. 8) is performed. As a result, the topcoat film is removed from the main surface of the wafer W.

Thereafter, the wafer W is taken out of the removing unit 700 by the substrate transfer device 182, and, then, transferred from the substrate transfer device 182 to the substrate transfer device 181 via the non-illustrated mounting table of the connecting unit 3A3. Then, the wafer W is transferred into a corresponding second liquid processing unit 19A by the substrate transfer device 181. After the chemical liquid process (block S109 of FIG. 8) is performed by the second liquid processing unit 19A, the wafer W is accommodated back into the carrier C through the second unloading process (block S110 of FIG. 8).

As stated above, the removing unit 700 configured to perform the removing liquid supplying process may be provided separately from the first block 3A1 including the mounting unit 16, the substrate transfer device 181 and the second liquid processing units 19A configured to perform the chemical liquid process. The removing unit 700 may be provided in the second block 3A2 connected to the first block 3A1 via the connecting unit 3A3. That is, the removing unit 700 may be additionally provided in the conventional post-treatment apparatus which does not have the removing unit 700.

In such a configuration, by blocking the internal space of the connecting unit 3A3 from the atmosphere, the exposed Cu wiring 102 can be suppressed from being oxidized when transferring the wafer W from the second block 3A2 to the first block 3A1 after the removing process. In addition, in the second processing apparatus 3A, the inside of the transfer unit 18 of the first block 3A1 and the inside of the transfer unit 18' of the second block 3A2 may also be blocked from the atmosphere.

In addition, the second block 3A2 may include the same loading/unloading station as the loading/unloading station 7. In this configuration, the wafer W having the topcoat film formed thereon is loaded from the loading/unloading station of the second block 3A2 into the inside of the second block 3A2, and the topcoat film is removed from the wafer W by the removing unit 700. Then, the wafer W is transferred into the first block 3A1 via the connecting unit 3A3. Thus, transfer efficiency of the wafer W can be improved.

Fourth Example Embodiment

Figure 14:
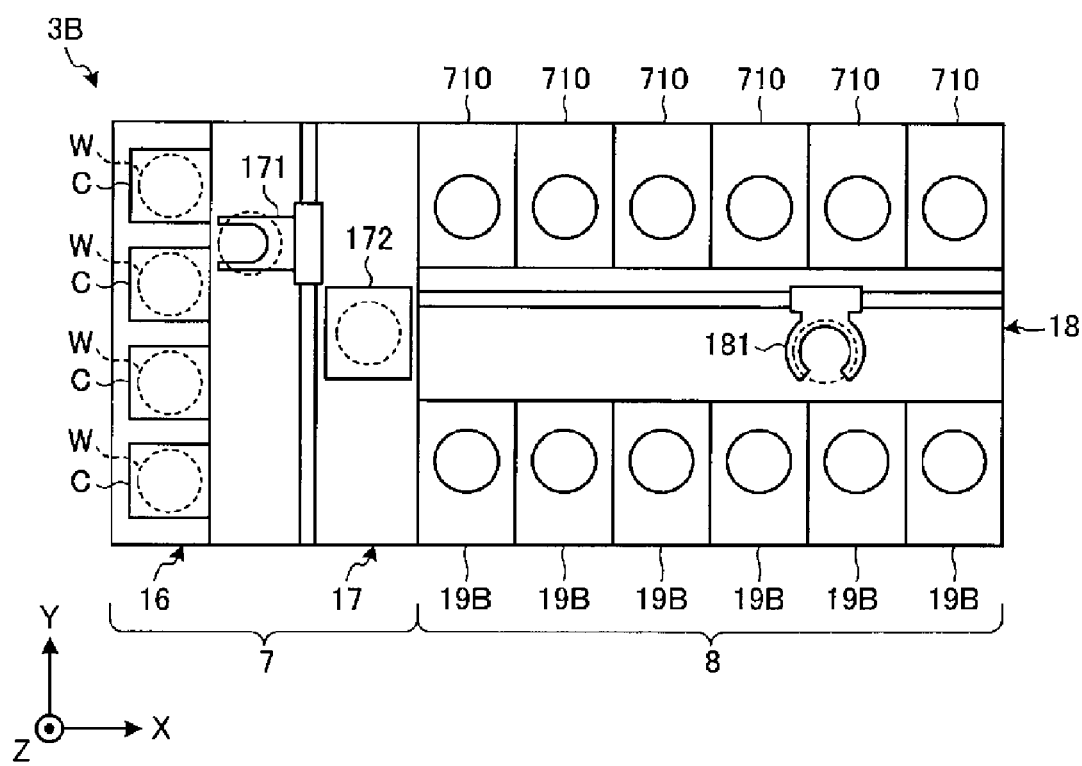
FIG. 14 is a diagram depicting a schematic configuration of a second processing apparatus in accordance with a fourth example embodiment.

The above example embodiments have been described for an example case of removing the topcoat film from the wafer W by supplying the alkali developer as a removing liquid to the topcoat film. However, the process of removing the topcoat film from the wafer W may not be limited to the above-described examples. Hereinafter, another example removing process of removing the topcoat film from the wafer W will be elaborated. FIG. 14 is a diagram illustrating a schematic configuration of a second processing apparatus in accordance with a fourth example embodiment.

As illustrated in FIG. 14, a second processing apparatus 3B in accordance with the fourth example embodiment includes, in a processing station 8, a multiple number of second liquid processing units 19B and a multiple number of removing units 710.

Each of the second liquid processing units 19B has the same configuration as that of the second liquid processing unit 19A in the third example embodiment. That is, the second liquid processing unit 19B has the same configuration as that of the second liquid processing unit 19 of the first example embodiment excepting that the components related to a removing liquid supplying process, i.e., the nozzle 81b, the valve 84b and the alkali developer supply source 85b are omitted in the second liquid processing unit 19B.

Figure 15:
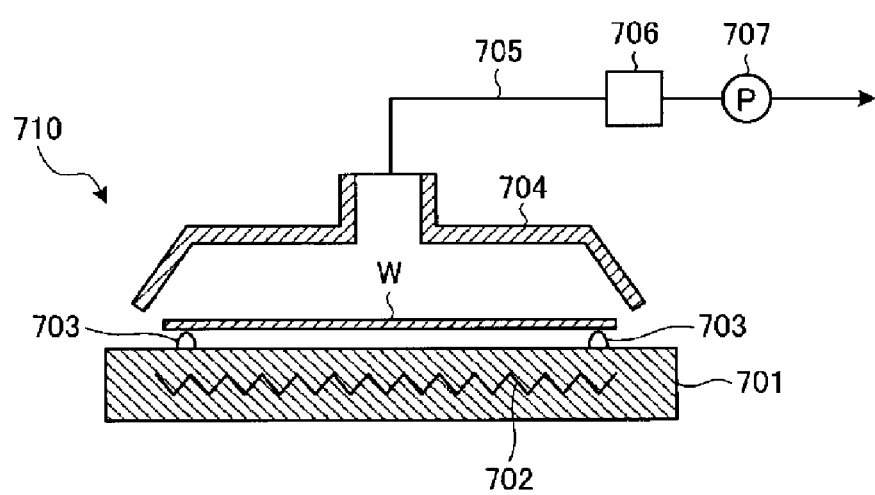
FIG. 15 is a diagram depicting a schematic configuration of a removing unit in accordance with the fourth example embodiment.

Each of the removing units 710 is configured to remove a film formed on a wafer W by sublimation. Here, a configuration of the removing unit 710 will be described with reference to FIG. 15. FIG. 15 is a schematic diagram illustrating an example configuration of the removing unit 710 in accordance with the fourth example embodiment.

In the fourth example embodiment, a liquid of a sublimation material is used as the film forming liquid. By way of non-limiting example, ammonium fluorosilicate, camphor, naphthalene or the like may be used as the sublimation material. The film forming liquid is obtained by dissolving the sublimation material in a volatile solvent such as IPA. Such a film forming liquid is solidified or cured into a film as a result of volatilization of IPA serving as the solvent. The film forming liquid may include pure water besides the sublimation material and the IPA.

As illustrated in FIG. 15, the removing unit 710 includes a hot plate 701 having a heater 702 embedded therein, and a multiple number of support pins 703 protruded from a top surface of the hot plate 701. The support pins 703 support a peripheral portion of a rear surface of a wafer W. Accordingly, a small gap is formed between the rear surface of the wafer W and the top surface of the hot plate 701.

Above the hot plate 701, there is provided an exhaust hood 704, which is configured to be moved up and down. The exhaust hood 704 has an opening at a central portion thereof. An exhaust line 705, at which a sublimation material collecting device 706 and a pump 707 are provided, is connected to the opening of the hot plate 701. Here, as the sublimation material collecting device 706, there may be employed various commonly known sublimation material collecting devices, such as a device in which a sublimation material is precipitated on a cooling plate provided within a chamber through which an exhaust gas flows, or a device in which a cooling fluid is contacted with a gas of a sublimation material within a chamber through which an exhaust gas flows.

If a wafer W is mounted on the support pins 703 by the substrate transfer device 181, the removing unit 710 lowers the exhaust hood 704 to form a processing space between the exhaust hood 704 and the hot plate 701. Subsequently, while exhausting the space above the wafer W by the pump 707 provided on the exhaust line 705 connected to the exhaust hood 704, the removing unit 710 heats the wafer W to a temperature higher than a sublimation temperature of the sublimation material by the temperature-raised hot plate 701.

As a result, the sublimation material on the wafer W is sublimated and removed from the wafer W. At this time, the sublimation material, which has been sublimated and tuned into a gas, is collected by the sublimation material collecting device 706 to be reused. Thereafter, the wafer W is taken out of the removing unit 710 and transferred into the second liquid processing unit 19B by the substrate transfer device 181.

As described above, the second processing apparatus 3B may perform the removing process of removing the solidified or cured film forming liquid from the wafer W by heating the wafer W to a higher temperature than the sublimation temperature of the sublimation material contained in the film forming liquid. Further, the sublimation process adopted therein is nothing more than an example, and there may be employed a process of directly overheating the sublimation material itself, and not the substrate, by a gas or the like. Further, the heating process may not be performed, depending on a sublimation temperature of the sublimation material.

Fifth Example Embodiment

Figure 16:
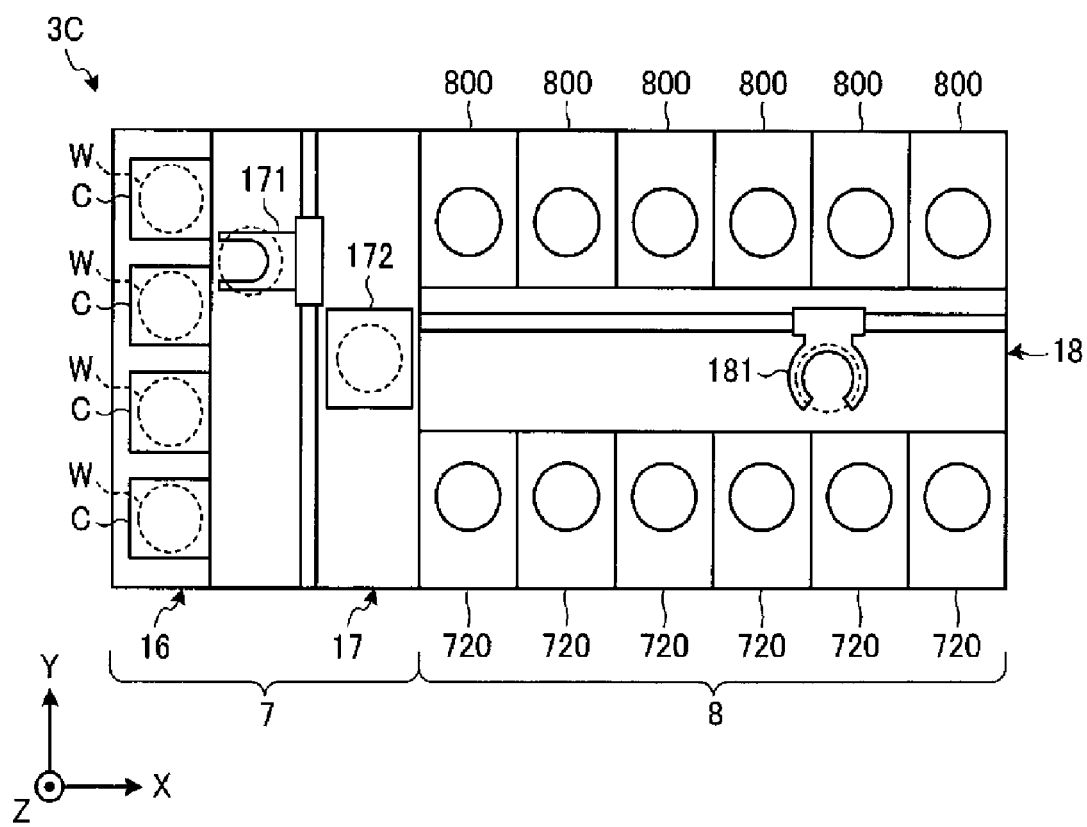
FIG. 16 is a diagram depicting a schematic configuration of a second processing apparatus in accordance with a fifth example embodiment.

The above example embodiments have been described for the case of performing the chemical liquid process as a post-treatment after removing the solidified or cured film forming liquid from the wafer W. However, the post-treatment may not be limited to the chemical liquid process. In a fifth example embodiment, an example of performing a dry etching process as the post-treatment will be described with reference to FIG. 16. FIG. 16 is a diagram depicting a schematic configuration of a second processing apparatus in accordance with the fifth example embodiment.

As illustrated in FIG. 16, a second processing apparatus 3C in accordance with the fifth example embodiment includes, in a processing station 8, a multiple number of removing units 720 and a multiple number of dry etching units 800.

Each of the removing units 720 has the same configuration as that of the removing unit 710 of the fourth example embodiment and is configured to remove a solidified or cured film forming liquid from a wafer W through sublimation. Alternatively, the removing unit 720 may have the same configuration as that of the removing unit 700 of the third example embodiment and may be configured to remove the solidified or cured film forming liquid from the wafer W by using a removing liquid such as an alkali developer.

Each of the dry etching units 800 has the same configuration as that of the dry etching unit 12 of the first example embodiment and is configured to perform a dry etching process on the wafer W from which the solidified or cured film forming liquid has been removed by the removing unit 720. Upon the completion of the dry etching process, the wafer W is accommodated in the carrier C through the second unloading process (block S110 of FIG. 8).

As stated above, the second processing apparatus 3C may implement the dry etching process as the post-treatment. That is, it is also possible to apply the above-described film forming liquid supplying process and removing process to a process in which a dry etching is performed as a pre-treatment and then further performed as a post-treatment once more.

As one example of such a process, a hard mask etching of etching a hard mask may be performed as a pre-treatment, and, then, a main etching of etching a target film on the wafer W may be performed as a post-treatment. By applying the above-described film forming liquid supplying process and removing process to this process, it is possible to suppress a reaction product P from growing after the hard mask etching or to stabilize a profile of the target film when performing the main etching.

In case of performing the removing process by sublimation as described in the fourth example embodiment, it is also possible to perform the removing process within the dry etching unit 800.

Sixth Example Embodiment

The above example embodiments have been described for the case of applying the film forming liquid supplying process of supplying the film forming liquid to the wafer W after the pre-treatment and the removing process of removing the solidified or cured film forming liquid from the wafer W to the process in which the dry etching is performed as the pre-treatment and the chemical liquid process or the dry etching process are performed as the post-treatment. However, the application of the film forming liquid supplying process and the removing process may not be limited to the above example, and the film forming liquid supplying process and the removing process as described above may also be applicable to various processes performed in FEOL (Front End Of Line), MEOL (Middle End Of Line) and BEOL (Back End Of Line).

Accordingly, in this sixth example embodiment, various processes to which the film forming liquid supplying process and the removing process are applied will be described with reference to FIG. 17. FIG. 17 is a table showing example processes to which the film forming liquid supplying process and the removing process are applied.

The film forming liquid supplying process and the removing process are applicable to a process which requires atmosphere management or time management for a wafer W on which a pre-treatment is performed. Here, the term "atmosphere management" means, for example, controlling an atmosphere surrounding the wafer W after the pre-treatment to be an inert gas atmosphere. Further, the term "time management" means the Q-time management, which delimits and manages the time from a pre-treatment to a post-treatment.

That is, the process to which the film forming liquid supplying process and the removing process are applied is a process in which the atmosphere management or the time management described above is required since a portion of a surface of a wafer W is modified by being exposed to the atmosphere after being subject to a pre-treatment. By applying the film forming liquid supplying process and the removing process to this process, the portion to be modified by being exposed to the atmosphere can be covered with the solidified or cured film forming liquid and blocked from the atmosphere. Thus, the atmosphere management and the time management after the pre-treatment may become unnecessary.

As shown in FIG. 17, as an example of the process to which the film forming liquid supplying process and the removing process are applicable, there is a process of performing wet-cleaning (post-treatment) after the dry etching (pre-treatment). An example of this process may be a process described in the first example embodiment, i.e., a process of post-cleaning a wafer W by a chemical liquid after exposing a metal layer (which is not limited to Cu but includes Co (cobalt), W (tungsten), or the like) within a wafer W through the dry etching. Further, examples of this process may be a process of post-cleaning a wafer W by a chemical liquid after patterning Si, $SiO_2$, SiN, a poly silicon gate electrode, a HKMG (High-k/Metal Gate), or the like through the dry etching; a process of post-cleaning a wafer W by a chemical liquid after forming a contact hole through the dry etching; and so forth. By applying the film forming liquid supplying process and the removing process to these processes, it is possible to suppress the reaction products from growing after the pre-treatment, for example. As for the pre-treatment, the ashing as well as the dry etching may also be employed, and even in case of performing the ashing as the pre-treatment, it is still possible to apply the film forming liquid supplying process and the removing process.

In addition, as another example of a process to which the film forming liquid supplying process and the removing process are applicable, there is a process of performing the dry etching (post-treatment) after the dry etching (pre-treatment). Such a process may be, for example, a process as described in the fifth example embodiment. In this case as well, by applying the film forming liquid supplying process and the removing process, the reaction products after the pre-treatment can be suppressed from growing.

As yet another example of a process to which the film forming liquid supplying process and the removing process are applicable, there is a process of performing film formation (post-treatment) after film formation (pre-treatment). Examples of such a process may include, but not limited to, a process of forming a W layer on a wafer W after forming a TiN layer on the wafer W, forming a Cu layer on a wafer W after forming a TaN layer on the wafer W, and so forth.

Here, among the film forming apparatuses configured to perform the film forming processes, the film forming apparatus for the pre-treatment is arranged in the processing station of the first processing apparatus, whereas the film forming apparatus for the post-treatment is arranged in the processing station of the second processing apparatus. As the film forming apparatus, a plasma CVD apparatus may be used, but not limited thereto and various commonly known techniques can be performed.

In addition, in case that a plasma CVD apparatus is used as a film forming apparatus for the post-treatment and the removing process is performed by sublimation as described in the fourth example embodiment, it is possible to perform the removing process within the plasma CVD apparatus. Further, in case that a film forming apparatus configured to perform the film formation by the wet process is used as the film forming apparatus for the pre-treatment, it is possible to perform the film forming liquid supplying process within that film forming apparatus.

As still another example process to which the film forming liquid supplying process and the removing process are applicable, there is a process of performing the film formation (post-treatment) after the wet cleaning (pre-treatment). This process may be, for example, a process of forming a metal film such as a barrier metal on a wafer W after removing an oxide film or foreign substances such as particles from the wafer W by pre-cleaning the wafer W with a chemical liquid. By applying the film forming liquid supplying process and the removing process to such a process, it is possible to suppress the formed metal film from being oxidized or the particles from being attached onto the wafer W, for example.

In case of applying the film forming liquid supplying process and the removing process to a process in which the wet cleaning is performed as a pre-treatment, it is desirable to perform the removing process by sublimation as described in the fourth example embodiment.

That is, by performing the film forming liquid supplying process after the wet cleaning to form a film of the film forming liquid on the wafer W, a pattern collapse in the drying process can be suppressed. In addition, by removing the film of the film forming liquid through sublimation in the removing process, it is possible to remove the film of the film forming liquid from the wafer W without causing the pattern collapse.

The process of performing the other surface process as described in the second example embodiment, the configurations of the first processing apparatus and the second processing apparatus as described in the third example embodiment, and the removing process by sublimation as described in the fourth example embodiment may be appropriately applied to each of the processes specified in FIG. 17.

Other Example Embodiments

The foregoing example embodiments have been described for the case of using a topcoat liquid or a sublimation material liquid as a film forming liquid. However, the film forming liquid may not be limited to these examples.

By way of non-limiting example, the film forming liquid may be a processing liquid including a phenolic resin. Since the phenolic resin is also subject to curing and shrinkage like the above-described acrylic resin, using the phenolic resin may be effective in applying a tensile force to a reaction product P, like the topcoat liquid.

The film forming liquid including the phenolic resin may be, for example, a resist liquid. The resist liquid is a film forming liquid for forming a resist film on a wafer W. Specifically, the resist liquid includes a novolac resin.

If the resist liquid is used as the film forming liquid, a thinner capable of dissolving the resist liquid may be used as the removing liquid. When using the thinner as the removing liquid, it is possible to skip a rinsing process after a removing liquid supplying process. Further, when using the resist liquid used as the film forming liquid, the removing liquid may be supplied after performing an exposure process of exposing, for example, the entire surface of the resist film formed on the wafer W. In this case, the removing liquid may be a developer or a thinner.

A synthetic resin contained in the film forming liquid is not limited to the acrylic resin or the phenolic resin, and may not be particularly limited as long as it is subject to cure shrinkage. For example, the synthetic resin included in the film forming liquid may be an epoxy resin, a melanin resin, an urea resin, an unsaturated polyester resin, an alkyd resin, polyurethane, polyimide, polyethylene, polypropylene, polyvinylchloride, polystyrene, poly vinylacetate, polytetra fluoroethylene, an acrylonitrile butadiene styrene resin, an acrylonitrile styrene resin, polyamide, nylon, polyacetal, polycarbonate, modified polyphenylene ether, polybutylene terephthalate, polyethylene terephthalate, polyphenylene sulfide, polysulfon, polyether ether ketone, polyamide amide, and so forth.

In addition, an anti-reflection film liquid may be used as the film forming liquid. The anti-reflection film liquid is a film forming liquid for forming an anti-reflection film on a wafer W. Further, the anti-reflection film is also a protection film for reducing surface reflection of the wafer W while increasing transmittance. If such an anti-reflection film liquid is used as the film forming liquid, the DIW capable of dissolving the anti-reflection film liquid may be used as the removing liquid.

Further, the film forming liquid may further include a certain chemical liquid, which dissolves a material formed on the wafer W or foreign substances attached on the wafer W, in addition to the volatile component and the synthetic resin. The "material formed on the wafer W" may refer to, for example, the Cu wiring 102, and the "foreign substances attached on the wafer W" means, for example, a reaction product P. In addition, the "certain chemical liquid" may be, but not limited to, hydrogen fluoride, ammonium fluoride, hydrochloric acid, sulfuric acid, hydrogen peroxide water, phosphoric acid, acetic acid, nitric acid, ammonium hydroxide, organic acid, or an aqueous liquid containing ammonium fluoride. Since the adhesive strength of the reaction product P is weakened as a surface of the reaction product P is dissolved by the chemical liquid, the reaction product P may become easily removable.

The "certain chemical liquid" is used under the condition of a small etching amount, as compared to the chemical liquid used in the general chemical liquid cleaning process in which the cleaning is performed only by using a chemical operation of the chemical liquid. Accordingly, it is possible to remove the reaction product P more effectively, while suppressing erosion of the wafer W, as compared to the case of the general chemical liquid cleaning process.

Although the above-described example embodiments have been described for the case of using the alkali developer as the removing liquid, the removing liquid may be prepared by adding hydrogen peroxide water to the alkali developer. By adding the hydrogen peroxide water to the alkali developer, surface roughening of the wafer W caused by the alkali developer may be suppressed.

In addition, the removing liquid may be an organic solvent such as a thinner, toluene, acetic acid esters, alcohols, and glycols (propylene glycol monomethyl ether), or an acidic developer such as acetic acid, formic acid, or hydroxy acetic acid.

In addition, the removing liquid may further include a surfactant. Since the surfactant has a function to weaken a surface tension, it can suppress re-attachment of a reaction product P to a wafer W.

In addition, the above example embodiments have been described for the case where the metal wiring formed within the wafer W is the Cu wiring 102. However, the metal wiring is not limited to the Cu wiring 102. In this regard, the removing liquid for the topcoat film may contain an anti-corrosive material appropriately selected depending on the kind of the metal wiring.

In addition, in the above-described example embodiments, a target material of the dry etching is described to be a metal wiring. However, the target material or structure to be etched by the dry etching may not be limited to the metal wiring. Further, the substrate processing method in accordance with the first example embodiment may also be applied to a case of removing a reaction product after a resist is removed by the ashing. For example, the substrate processing method of the first example embodiment may also be effective when being applied to a wafer cleaning which is performed after injecting ions by using a resist pattern as a mask and removing the resist by the ashing.

Furthermore, the above-described example embodiments have been described for the case of performing the chemical liquid process before the film forming liquid supplying process and, also, after the removing liquid supplying process. However, the chemical liquid process may be performed either before the film forming liquid supplying process or after the removing liquid supplying process. Moreover, the chemical liquid process may not necessarily be performed.

In addition, in case of performing the chemical liquid process after the removing liquid supplying process, the liquid supply unit 40_1 included in the first liquid processing unit 14 may be provided in the second liquid processing unit 19, or a separate processing unit configured to perform the chemical liquid cleaning may be additionally provided.

Further, the configuration of the substrate processing system 1 may not be limited to that described in the foregoing example embodiments.

By way of example, the configuration of the liquid supply unit 80 included in the second liquid processing unit 19 may be provided in another film forming unit configured to perform a film forming process on a wafer W having undergone the processes up to block S107 of FIG. 8. That is, removing the topcoat film may be performed in another film forming unit. Alternatively, a film forming unit may be provided in the processing station 8 of the second processing apparatus 3, and the film forming process may be performed within the second liquid processing unit 19. In such a case, since the film forming process can be performed immediately after the topcoat film is removed, the Q-time management can be further facilitated.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

We claim:

1. A substrate processing method, comprising:
   a pre-treatment process of performing dry etching or ashing on a substrate;
   a processing liquid supplying process of supplying a processing liquid, which contains a volatile component and forms a film on the substrate, onto the substrate after the pre-treatment process;
   a solidifying or curing process of solidifying or curing the processing liquid by volatilization of the volatile component;
   an other surface process of cleaning, in a state that an entire main surface of the substrate is covered with the solidified or cured processing liquid, an other surface of the substrate by jetting gas clusters to the other surface of the substrate; and
   an accommodating process of accommodating, in a transfer container, the substrate after the other surface process.

2. The substrate processing method of claim 1,
   wherein the pre-treatment is a process in which a portion to be modified by being exposed to the atmosphere is formed on a surface of the substrate.

3. The substrate processing method of claim 1, further comprising:
   an unloading process of taking out the substrate accommodated in the transfer container after the processing liquid supplying process; and
   a removing process of removing the solidified or cured processing liquid from the substrate after the unloading process.

4. The substrate processing method of claim 3, further comprising:
   a post-treatment process of performing a preset post-treatment on the substrate after the removing process.

5. The substrate processing method of claim 4,
   wherein the post-treatment is a process in which wet cleaning is performed on the substrate after the removing process.

6. The substrate processing method of claim 4,
   wherein the post-treatment is a process in which dry etching is performed on the substrate after the removing process.

7. The substrate processing method of claim 4,
   wherein in the pre-treatment process, a metal film is formed in the substrate before the processing liquid supplying process, and
   the post-treatment is a process in which a metal film is formed on the substrate after the removing process.

8. The substrate processing method of claim 4,
   wherein in the pre-treatment process, wet cleaning is performed on the substrate before the processing liquid supplying process, and
   the post-treatment is a process in which a metal film is formed on the substrate after the removing process.

9. The substrate processing method of claim 4,
   wherein in the pre-treatment process, wet cleaning is performed on the substrate before the processing liquid supplying process,
   the processing liquid is a liquid of a sublimation material, and
   in the removing process, the solidified or cured processing liquid is removed from the substrate by sublimation.

10. The substrate processing method of claim 3,
    wherein, in the removing process, the solidified or cured processing liquid is removed from the substrate by supplying a removing liquid.

11. The substrate processing method of claim 10,
    wherein the removing liquid contains an anticorrosive material for a metal wiring formed in the substrate.

* * * * *

UNITED STATES PATENT AND TRADEMARK OFFICE
CERTIFICATE OF CORRECTION

PATENT NO. : 10,835,908 B2
APPLICATION NO. : 15/988129
DATED : November 17, 2020
INVENTOR(S) : Miyako Kaneko et al.

It is certified that error appears in the above-identified patent and that said Letters Patent is hereby corrected as shown below:

In the Specification

Column 4, Line 46, please change "aching" to -- ashing --.

Column 4, Line 64, please change "aching" to -- ashing --.

Column 7, Line 16, please change "aching" to -- ashing --.

Column 9, Line 20, please change "aching" to -- ashing --.

Column 12, Line 31, please change "aching" to -- ashing --.

Column 16, Line 43, please change "aching" to -- ashing --.

Signed and Sealed this
Fifteenth Day of June, 2021

Drew Hirshfeld
*Performing the Functions and Duties of the*
*Under Secretary of Commerce for Intellectual Property and*
*Director of the United States Patent and Trademark Office*